United States Patent
Pinciuc et al.

(10) Patent No.: US 12,019,470 B2
(45) Date of Patent: *Jun. 25, 2024

(54) ELECTRONIC DEVICE WITH MAGNETIC FIELD SENSOR DESIGN FOR DETECTION OF MULTIPLE ACCESSORIES

(71) Applicant: Apple Inc., Cupertino, CA (US)

(72) Inventors: Christopher M. Pinciuc, Cupertino, CA (US); Zhen Zhang, Gilroy, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,725

(22) Filed: Aug. 8, 2023

(65) Prior Publication Data
US 2023/0384821 A1 Nov. 30, 2023

Related U.S. Application Data

(63) Continuation of application No. 17/027,605, filed on Sep. 21, 2020, now Pat. No. 11,775,006.
(Continued)

(51) Int. Cl.
*G06F 1/16* (2006.01)
*G01R 33/00* (2006.01)
(Continued)

(52) U.S. Cl.
CPC ....... *G06F 1/1607* (2013.01); *G01R 33/0047* (2013.01); *G01R 33/07* (2013.01);
(Continued)

(58) Field of Classification Search
CPC .............. G01R 33/096; G01R 33/0058; G01R 33/0047; G01R 33/07; G01R 33/0076;
(Continued)

(56) References Cited

U.S. PATENT DOCUMENTS 9,954,571 B2 4/2018 Sartee et al.
2010/0322447 A1* 12/2010 Van Halteren ....... H04R 25/558
381/355
(Continued)

FOREIGN PATENT DOCUMENTS

CN 104122831 A * 10/2014 ............. G01B 7/003
CN 104122831 A 10/2014
(Continued)

OTHER PUBLICATIONS

Machine translation of Srec Chinese Patent Document CN 106055042 B May 19, 2020 (Year: 2020).*
(Continued)

*Primary Examiner* — Kevin J Comber
(74) *Attorney, Agent, or Firm* — BAKERHOSTETLER

(57) ABSTRACT

An electronic device is disclosed. The electronic device includes a device magnet designed to magnetically couple with an accessory device magnet. The electronic device further includes a display assembly and a magnetic field sensor configured to detect the accessory device magnet, thereby providing an indication that the accessory device is covering the display assembly. The electronic device further includes a shunt assembly designed to reduce the magnitude of the magnetic field of the device magnet, as determined by the magnetic field sensor, while allowing the magnetic field from the accessory device to sufficiently reach the magnetic field sensor. As such, the magnetic field sensor can be placed near the device magnet without triggering the magnetic field sensor. The electronic device may further include a microphone. Communication between the microphone and an integrated circuit can cease based on the magnetic field sensor detecting the accessory device magnet.

20 Claims, 19 Drawing Sheets

Related U.S. Application Data

(60) Provisional application No. 63/041,075, filed on Jun. 18, 2020, provisional application No. 63/003,881, filed on Apr. 1, 2020.

(51) Int. Cl.
| | | |
|---|---|---|
| *G01R 33/07* | (2006.01) | |
| *G01R 33/09* | (2006.01) | |
| *H01F 7/06* | (2006.01) | |
| *H05K 5/00* | (2006.01) | |
| *H05K 5/02* | (2006.01) | |

(52) U.S. Cl.
CPC ............. *G01R 33/096* (2013.01); *H01F 7/06* (2013.01); *H05K 5/0017* (2013.01); *H05K 5/0204* (2013.01)

(58) Field of Classification Search
CPC . G01R 33/0026; G06F 1/1607; G06F 1/1669; G06F 1/1626; H05K 5/0204; H05K 5/0017; H01F 7/06
USPC ........................................................ 361/142
See application file for complete search history.

(56) References Cited

U.S. PATENT DOCUMENTS

| | | |
|---|---|---|
| 2014/0320114 A1 | 10/2014 | Enkovaara |
| 2014/0342671 A1 | 11/2014 | Kim et al. |
| 2015/0316394 A1 | 11/2015 | Kim et al. |
| 2016/0146903 A1 | 5/2016 | Yang et al. |
| 2016/0323006 A1* | 11/2016 | Sartee .................. H04M 1/0266 |
| 2018/0088690 A1 | 3/2018 | Seo et al. |
| 2018/0122235 A1* | 5/2018 | Hanks .................... G08G 1/162 |
| 2020/0089285 A1 | 3/2020 | Gilbert et al. |
| 2020/0096579 A1* | 3/2020 | Renda ................. G01R 33/096 |
| 2020/0363482 A1 | 11/2020 | Chilcote et al. |

FOREIGN PATENT DOCUMENTS

| | | | | |
|---|---|---|---|---|
| CN | 105044630 A | 11/2015 | | |
| CN | 105629184 A | 6/2016 | | |
| CN | 110088711 A | * 8/2019 | ............. | G01B 7/003 |
| CN | 110088711 A | 8/2019 | | |
| CN | 110955298 A | 4/2020 | | |
| CN | 210348417 U | 4/2020 | | |
| CN | 106055042 B | * 5/2020 | ............... | G06F 1/16 |
| CN | 106055042 B | 5/2020 | | |
| CN | 111948584 A | 11/2020 | | |
| EP | 2009956 A2 | 2/2008 | | |
| KR | 2007060096 A | * 6/2007 | ............. | B82Y 25/00 |
| KR | 2007060096 A | 6/2007 | | |
| WO | WO 2020/107401 | 6/2020 | | |

OTHER PUBLICATIONS

Machine translation of Cherkashin et al. Chinese Patent Document CN 110088711 A Aug. 2, 2019 (Year: 2019).*
Machine translation of Hoeven Korean Patent Document KR 20070060096 A Mar. 26, 2007 (Year: 2007).*
Machine translation of Encovara Chinese Patent Document CN 104122831 A Apr. 24, 2014 (Year: 2014).*
Chinese Utility Model Patentability Evaluation Report from Chinese Patent Application No. 202120648511.X, dated Feb. 11, 2022.

* cited by examiner

ELECTRONIC DEVICE WITH MAGNETIC FIELD SENSOR DESIGN FOR DETECTION OF MULTIPLE ACCESSORIES

CROSS-REFERENCE TO RELATED APPLICATIONS

The present application is a continuation of U.S. non-provisional application Ser. No. 17/027,605, entitled "ELECTRONIC DEVICE WITH MAGNETIC FIELD SENSOR DESIGN FOR DETECTION OF MULTIPLE ACCESSORIES," filed Sep. 21, 2020, which claims the benefit of U.S. Provisional Application No. 63/003,881, entitled "ELECTRONIC DEVICE WITH MAGNETIC FIELD SENSOR DESIGN FOR DETECTION OF MULTIPLE ACCESSORIES," filed Apr. 1, 2020, and U.S. Provisional Application No. 63/041,075, entitled "ELECTRONIC DEVICE WITH MAGNETIC FIELD SENSOR DESIGN FOR DETECTION OF MULTIPLE ACCESSORIES," filed Jun. 18, 2020, the contents of which are incorporated herein by reference in their entirety for all purposes.

FIELD

The following description relates to electronic devices. In particular, the following description relates to electronic devices, including portable electronic devices, with modifications designed to limit or prevent transmission of magnetic flux using a shunt assembly so as to prevent detection of the magnetic flux by a magnetic field sensor. However, while the shunt assembly limits transmission of magnetic flux by some magnets, the shunt assembly can allow or enhance transmission of magnetic flux by other magnets so as to promote detection of magnetic flux by the magnetic field sensor. Regarding the latter, the shunt assembly can promote compatibility of multiple accessory devices with the electronic device. Further, the magnetic field sensor can be used as an input to prevent communication by a microphone as an input to an integrated circuit.

BACKGROUND

Electronic devices use sensors to detect the presence of an accessory device. For example, an electronic device may use a sensor to determine whether a display of the electronic device is covered by the accessory device, and the electronic device can determine whether to activate or deactivate the display based upon whether the display is uncovered or covered, respectively. Additionally, in order to render multiple accessory devices compatible with the electronic device, the electronic device includes multiple sensors, with some sensors positioned in a particular location (of the electronic device) to detect a particular accessory device.

However, additional design modifications to electronic device can create certain drawbacks. For example, some electronic device with increased battery dimensions (offering longer device usage times) can limit the number of locations for a sensor. Further, when the sensor is a magnetic field sensor used to detect a magnet in an accessory device, the magnetic field sensor should not be placed in proximity to magnets within the electronic device for risk of the magnetic field sensor detecting the magnets within the electronics device. By limiting the location of the magnetic field sensor, similar corresponding limitations must be placed on the magnets (used as targets) in the accessory devices. Accordingly, without additional modifications, a magnetic field sensor within the electronic device has considerable limits.

SUMMARY

In one aspect, an electronic device is described. The electronic device may include a display assembly. The electronic device may further include an enclosure coupled with the display assembly. The enclosure can define an internal volume that carries components. The components may include a device magnet that emits a first magnetic field. The components may further include a magnetic field sensor configured to generate a switching signal based upon detection of at least a threshold magnetic field. The components may further include a shunt assembly that alters the first magnetic field below the threshold magnetic field at the magnetic field sensor. In some embodiments, the magnetic field sensor provides the switching signal based upon detection of a second magnetic field from a magnet external to the enclosure and the display assembly.

In another aspect, an electronic device is described. The electronic device may include a display assembly. The electronic device may further include an enclosure coupled with the display assembly. The enclosure can define an internal volume that carries components. The components may include a device magnet that emits a magnetic field. The components may further include a magnetic field sensor configured to provide a switching signal when an external magnetic field provided by an external magnet is detected. The components may further include an integrated circuit. The components may further include a microphone electrically coupled with the integrated circuit. The components may further include a switching circuit that forms a circuit with the microphone and the integrated circuit. In some embodiments, the switching circuit opens the circuit when the magnetic field sensor provides the switching signal. The components may further include a shunt assembly that at least partially absorbs the magnetic field by the device magnet such that the magnetic field sensor does not detect the magnetic field.

In another aspect, an electronic device is described. The electronic device may include a display assembly. The electronic device may further include an enclosure coupled with the display assembly. The enclosure can define an internal volume that carries components. The components may include a microphone. The components may further include an integrated circuit. The components may further include a magnetic field sensor configured to provide an electrical signal based upon detection of a threshold magnetic field. In some embodiments, the microphone is deactivated when the integrated circuit receives the electrical signal. The components may further include a device magnet that emits a first magnetic field greater than the threshold magnetic field. The components may further include a shunt assembly that alters that at least partially absorbs the first magnetic field, thereby reducing the first magnetic field to a second magnetic field at the magnetic field sensor. The second magnetic field may be less than the threshold magnetic field.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
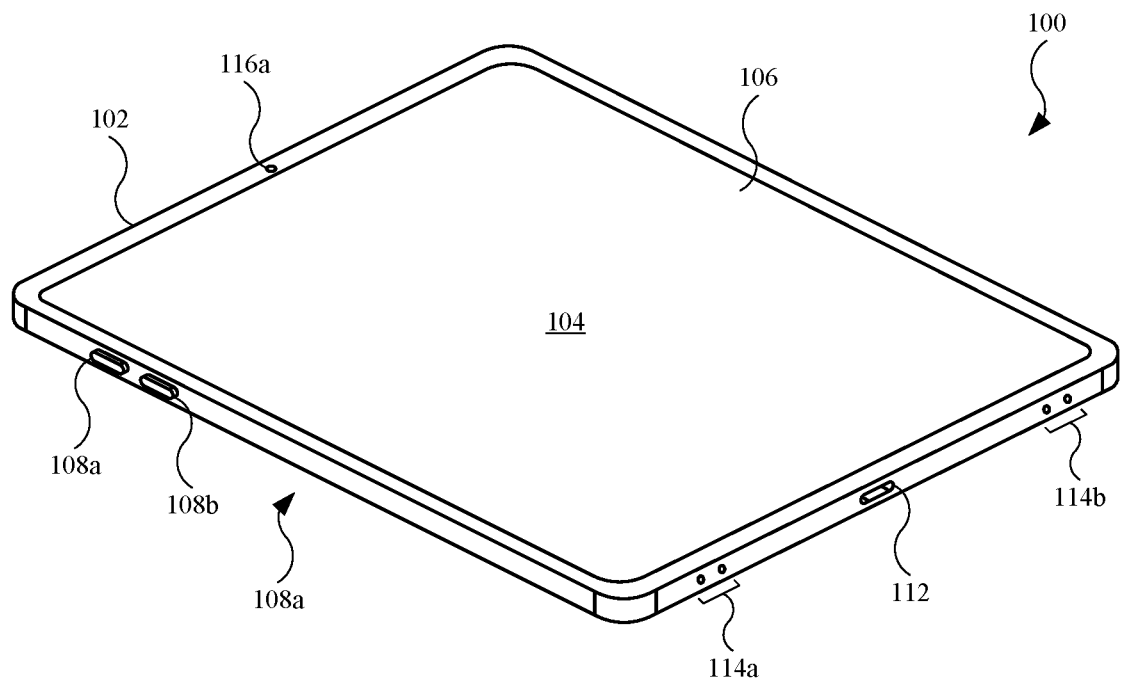
FIG. 1 illustrates a front isometric view of an embodiment of an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to electronic devices, such as mobile wireless computing devices (including smartphones and tablet computing devices). In particular, the electronic devices described herein includes modifications and enhancements that allow an electronic device to rely upon a magnetic field sensor to detect a magnet in different accessory devices, despite the varying location of the magnet in the respective accessory devices. By detecting the magnet in the accessory device, the magnetic field sensor can signal to the electronic device that a display assembly (of the electronic device) is covered by the accessory device, and the electronic device can subsequently deactivate the display assembly. In order for the magnetic field sensor to detect magnets in different (relative) positions in different accessory devices, the location of the magnetic field sensor can be relocated within the electronic device. However, the relocated magnetic field sensor may be positioned in proximity to a magnet within the electronic device.

In order to prevent unwanted detection of the magnet(s) within the electronic device, electronic devices described herein may include a shunt assembly. A shunt assembly described herein may include one or more magnetic shunts designed to prevent the magnetic field from detection by the magnetic field sensor. For example, the shunt assembly can redirect, or divert, the magnetic field generated by a magnet(s) within the electronic device, and as a result, the magnetic field sensor does not detect the magnetic field. Alternatively, the shunt assembly may minimize the magnetic field generated by the magnet(s) such that the magnetic field detected by the magnetic field sensor is below a threshold magnetic field required trigger the magnetic field sensor and generate an electrical (indicating the presence of a magnet).

While shielding the magnetic field sensor from a magnetic field from magnets within the electronic device, the shunt assembly may allow detection of magnetic fields by magnets external to the electronic device. Moreover, the shunt assembly may direct a magnetic field from a magnet within accessory devices to the magnetic field sensor. As a result, the magnetic field sensor can detect the magnetic field while the magnet in the accessory devices is not directly aligned with the magnetic field sensor. In other words, the magnet in the accessory device may be offset with respect to the magnetic field sensor. This allows the magnetic field sensor to detect a magnet positioned in different locations, with the differing locations being a function of different accessory devices that are compatible with the electronic device.

Additionally, electronic devices described herein may include various input modules designed to capture user-generated information. For example, an electronic device may include a microphone designed to capture audible sound and provide electrical signals in accordance with the audible sound. In order to enhance privacy, the microphone can be deactivated when the magnetic field sensor detects the magnet in the accessory device. In some exemplary embodiments, the electrical signal generated by the magnetic field sensor (in response to detecting the magnet) can be used to disable the microphone, rendering the microphone unable to communicate with an integrated circuit, such as a system-on-chip ("SOC"), used to process the electrical signals provided by the microphone. As a result, the microphone is disabled and unable to communicate with the integrated circuit.

Moreover, the electrical signal provided by the magnetic field sensor can deactivate the microphone without intervening processes and/or controls by the integrated circuit. For example, the electronic device may include a switching circuit that forms a circuit with the microphone and the integrated circuit. When the switching circuit receives the electrical signal from the magnetic field sensor, the switching circuit opens a circuit, thereby preventing the microphone from communicating with the integrated circuit. The switching circuitry is designed to operate without a control signal(s) from the integrated circuit. Further, in some exemplary embodiments, the integrated circuit is unaware the microphone is unable to provide an input (in the form of electrical signals corresponding to audible sounds received by the microphone). In this manner, the integrated circuit does not monitor the microphone with respect to the ability of the microphone to communicate with the integrated circuit in an intended/desired manner. As a result, electronic devices described herein may include a disabling mechanism for preventing communication between the microphone and the integrated circuit without providing notification to the integrated circuit, with the disabling event triggered by the magnetic field sensor detecting a magnet, which corresponds to an accessory device covering the display of the electronic device. This feature may enhance a user's privacy as the electronic device will not "listen" to the user, i.e., the microphone will not relay audible sound (from the user) to the integrated circuit for further processing and/or memory storage.

These and other embodiments are discussed below with reference to FIGS. 1-22. However, those skilled in the art will readily appreciate that the detailed description given herein with respect to these Figures is for explanatory purposes only and should not be construed as limiting.

FIG. 1 illustrates a front isometric view of an embodiment of an electronic device 100. In some embodiments, electronic device 100 is a laptop computing device or a desktop computing device. In the embodiment shown in FIG. 1, electronic device 100 is a mobile wireless communication device, such as a smartphone or a tablet computing device.

As shown, electronic device 100 may include an enclosure 102, or housing, that provides a protective body as well as defines an internal volume, or cavity, that receives several components, such as processing circuitry, memory circuitry, batteries, speaker modules, microphones, cameras, antennae, and flexible circuits that electrically couples together the various components. Enclosure 102 may include a metal, such as aluminum, steel (including stainless steel), or a metal alloy that includes the aforementioned metals (as non-limiting examples). Alternatively, enclosure 102 may include non-metals, such as plastic or glass (as non-limiting examples).

Electronic device 100 may further include a display assembly 104. Display assembly 104 may include a touchscreen with capacitive touch input capabilities designed to receive user inputs and gestures. Electronic device 100 may further include a protective layer 106 that covers/overlays display assembly 104. Protective layer 106 can be formed from a transparent material, such as glass, plastic, or sapphire (as non-limiting examples). In order to receive additional inputs, electronic device 100 may further include a button 108a and a button 108b (each protruding through a respective opening of enclosure 102). Buttons 108a and 108b may be depressed to actuate a respective switch (not shown in FIG. 1) of electronic device 100.

Electronic device 100 may include a port 112 designed to electrically couple with an external source (not shown in FIG. 1), which may include an external data source and/or an external power source. Electronic device 100 may further include openings 114a and openings 114b, both formed in enclosure 102. Openings 114a and 114b may allow for acoustical energy transmission, in the form of audible sound, through enclosure 102. In this manner, electronic device 100 may include audio speakers and microphones (not shown in FIG. 1) that communicate with the external environment. Additionally, electronic device 100 may include a camera module 116a designed to capture still images and motion (video) images.

Figure 2:
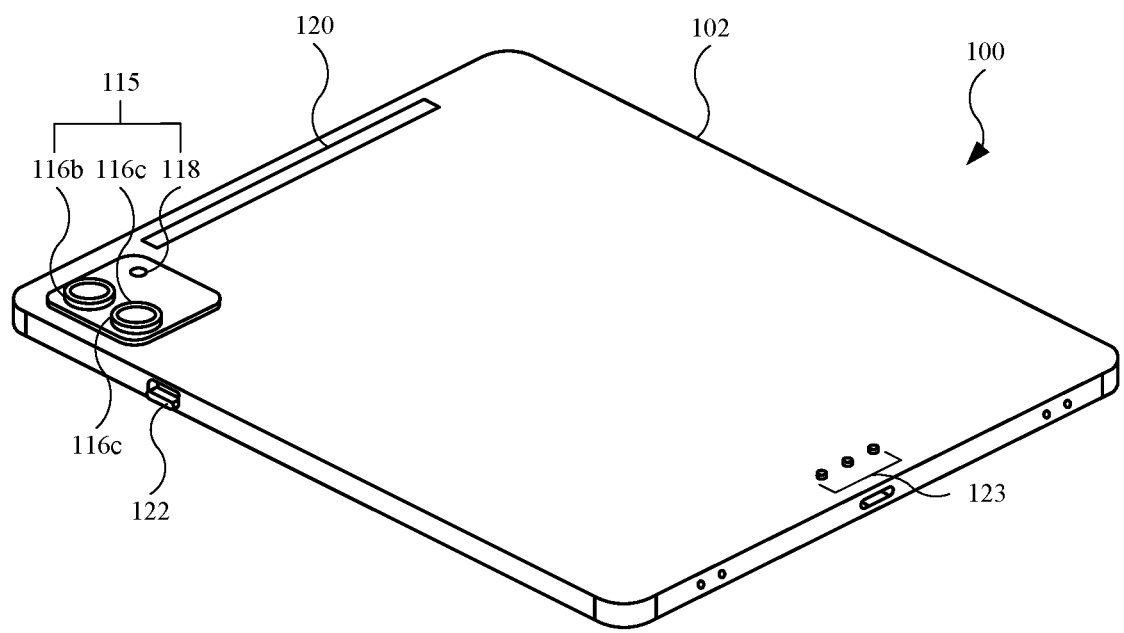
FIG. 2 illustrates a rear isometric view of the electronic device shown in FIG. 1.

FIG. 2 illustrates a rear isometric view of electronic device 100 shown in FIG. 1. As shown, electronic device 100 includes a camera assembly 115, which includes a camera module 116b and a camera module 116c. Camera modules 116b and 116c may provide any features described for camera module 116a (shown in FIG. 1), as well as additional resolution and zoom capabilities. Camera assembly 115 may further include a flash module 118 used to provide additional lighting during an image capture event by camera module 116b and/or camera module 116c. Electronic device 100 may further include a non-metal component 120 that defines a radio frequency ("RF") window. Non-metal component 120 may include plastic, glass, and/or resin. In this manner, non-metal component 120 allows RF transmission to and from antennae (not shown in FIG. 2) of electronic device 100. Electronic device 100 may further include a switch 122 that can be toggled by a user to change a configuration of electronic device 100, such as muting the audio speakers of electronic device 100. Also, electronic device 100 may include contacts 123. Contacts 123 may define electrical contacts designed to electrically couple electronic device 100 with an accessory device (not shown in FIG. 2).

Figure 3:
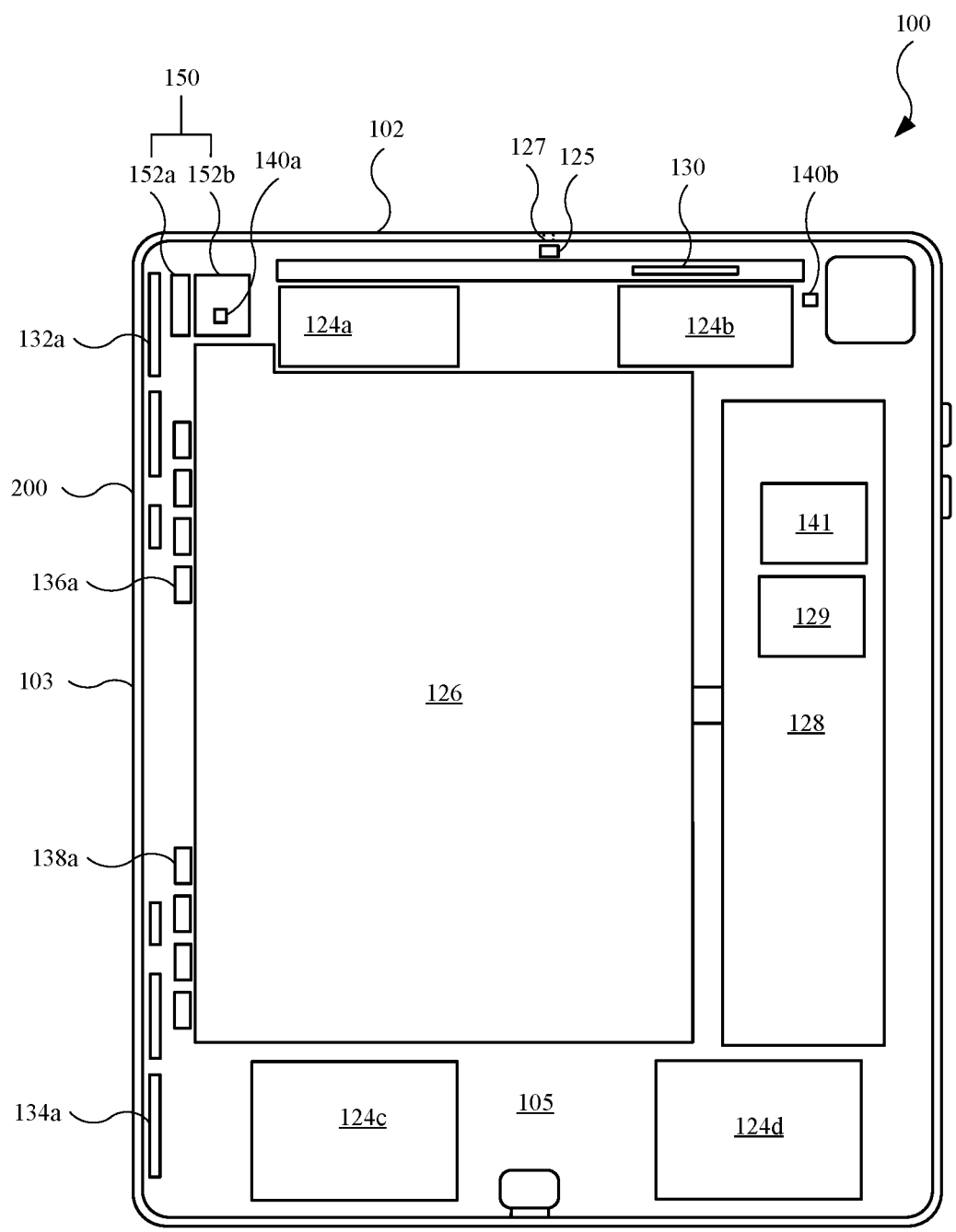
FIG. 3 illustrates a plan view of the electronic device, showing various internal features of the electronic device.

FIG. 3 illustrates a plan view of electronic device 100 shown in FIG. 1, showing various internal components of electronic device 100. For purposes of simplicity and illustration, display assembly 104 and protective layer 106 (shown in FIG. 1) are removed. Also, several additional components, such as flexible circuitry, are not shown. Electronic device 100 may include several speaker modules, such as a speaker module 124a, a speaker module 124b, a speaker module 124c, and a speaker module 124d. Although not shown in FIG. 3, electronic device 100 may include additional speaker modules. Further, electronic device 100 may include a microphone 125, or audio transducer, designed to receive audible sound and transmit information, in the form electrical signals, in accordance with the audible sound. In order for microphone 125 to receive audible sound external to electronic device 100, enclosure 102 may include an opening 127.

Electronic device 100 may include a power supply 126 (or battery) that provides electrical energy to operational components of electronic device 100. Electronic device 100 may further include a circuit board 128 that carries several components, such as processing circuits, memory circuits, integrated circuits (including application-specific integrated circuits, a central processing unit, system-on-chip ("SOC"), and a graphics processing unit, as non-limiting examples). As shown, an integrated circuit 129 is electrically coupled to circuit board 128. Integrated circuit 129 may include a SOC, as a non-limiting example, electrically coupled to microphone 125 (as well as additional microphones of the electronic device). In this regard, microphone 125 provides an input, in the form of electrical signals, to integrated circuit 129.

Electronic device 100 may further include an antenna 130 for wireless communication. Antenna 130 (representative of one or more antennae) may include an antenna that supports BLUETOOTH® or WI-FI® communication. Although not shown, electronic device 100 may include additional antennae in other locations, and as a result, electronic device 100 can support not only BLUETOOTH® and WI-FI® communication, but also cellular network communication.

Electronic device 100 may further include several magnets designed to magnetically couple with magnets in accessory devices (not shown in FIG. 3) that are compatible with electronic device 100. For example, electronic device 100 includes a magnet 132a and a magnet 134a, each of which are representative of additional magnets, designed to secure an accessory device to a sidewall 103, which defines an edge region of enclosure 102. Additionally, electronic device 100 includes a magnet 136a and a magnet 138a, each of which are representative of additional magnets, designed to secure an accessory device to a bottom wall 105, which defines rear or back wall of enclosure 102. The magnets located within, or carried by, electronic device 100, may be referred to as device magnets.

Some accessory devices are designed to cover electronic device 100, and in particular, display assembly 104 (shown in FIG. 1). As a result, when display assembly 104 is covered by an accessory device (shown later), it is generally advantageous to deactivate (i.e., disable or turn off) display assembly 104. In this regard, electronic device 100 may include a sensor 140a and a sensor 140b. In some embodiments, sensors 140a and 140b are magnetic field sensors, which may include a Hall Effect sensor or an anisotropic magneto-resistive ("AMR") sensor (as non-limiting examples). When sensors 140a and 140b are magnetic field sensors, sensors 140a and 140b can each detect a magnetic field through display assembly 104 from a magnet located in an accessory device (not shown in FIG. 3) that covers display assembly 104. Further, sensors 140a and 140b can be triggered by either polarity, i.e., either a North Pole or South Pole. Sensors 140a and 140b can subsequently provide a switching signal to integrated circuit 129. Based on the programming logic, when integrated circuit 129 receives an electrical signal from sensors 140a and 140b, integrated circuit 129 can provide a command to deactivate display assembly 104. When integrated circuit 129 no longer receives a respective electrical signal from sensors 140a and 140b, integrated circuit 129 can provide a command to activate display assembly 104.

Ideally, sensors 140a and 140b are sufficiently displaced from magnets within electronic device 100 so as to prevent sensor 140a and/or sensor 140b from false triggering, i.e., detecting magnetic fields from magnets within electronic device 100. While sensor 140b is sufficiently displaced from magnets within electronic device 100, sensor 140a is within proximity of magnet 132a such that a magnetic field (not shown in FIG. 3) emanating from magnet 132a can be detected by sensor 140a. However, electronic device 100 includes a shunt assembly 150 designed to prevent or limit the magnetic field generated by magnet 132a (as well as any other nearby magnet) from detection by sensor 140a. Shunt assembly 150 includes a size and shape, as well as a position within the electronic device, that reduces the magnetic field such that magnet 132a (as well as any other nearby magnet) does not provide a threshold magnetic field at sensor 140a. Furthermore, shunt assembly 150 does not prevent sensor 140a from detecting a magnetic field from a magnet external to electronic device 100, such as a magnet in an accessory device. This will be shown and described below.

Shunt assembly 150, also referred to as a magnetic shunt assembly, may include a shunt element 152a and a shunt element 152b, also referred to as a first shunt element and a second shunt element, respectively, or a first magnetic shunt and a second magnetic shunt, respectively. The components of shunt assembly 150 may include a metal, such as stainless steel (as a non-limiting example). As shown, sensor 140a is located on shunt element 152b. While a particular location is shown for the placement of sensor 140a on a surface shunt element 152b, sensor 140a can generally be placed anywhere on the surface of shunt element 152b.

Additionally, when sensor 140a detects the magnetic field, the electrical signal initiated by sensor 140a can be used to open a circuit between integrated circuit 129 and microphone 125 (as well as any additional microphones). In this regard, the electronic device 100 may further include a switching circuit 141. Switching circuit 141 may include a 2-, 3-, or 4-wire switch (as non-limiting examples), including a solid-state 2-, a 3-, or 4-wire switch. Switching circuit 141 is electrically coupled to sensor 140a, microphone 125, and integrated circuit 129. When sensor 140a detects a magnetic field (at or greater than a threshold magnetic field) and generates the electrical signal in accordance with the detected magnetic field, switching circuit 141 receives the electrical signal provided by sensor 140a and opens the circuit between microphone 125 and integrated circuit 129. As a result, integrated circuit 129 does not receive communication/input electrical signals provided by microphone 125.

Additionally, the electrical signal provided by sensor 140a need not be initially processed by integrated circuit 129 in order to open the circuit between microphone 125 and integrated circuit 129. Moreover, based the aforementioned design logic, integrated circuit 129 is not provided with information related to the open circuit caused by switching circuit 141, and thus does not actively monitor whether microphone 125 is operating in accordance with the desired function of detecting audible sound. As a result, a user of electronic device 100 may enjoy enhanced privacy as integrated circuit 129 cannot receive and process electrical signals from the microphone, nor is integrated circuit 129 provided with information that switching circuit 141 has opened the circuit and ceased communication between microphone 125 and integrated circuit 129. When switching circuit 141 no longer receives the electrical signal from the sensor 140a, the switching circuit 141 closes, thereby allowing microphone 125 to again communicate with the integrated circuit 129.

Figure 4:
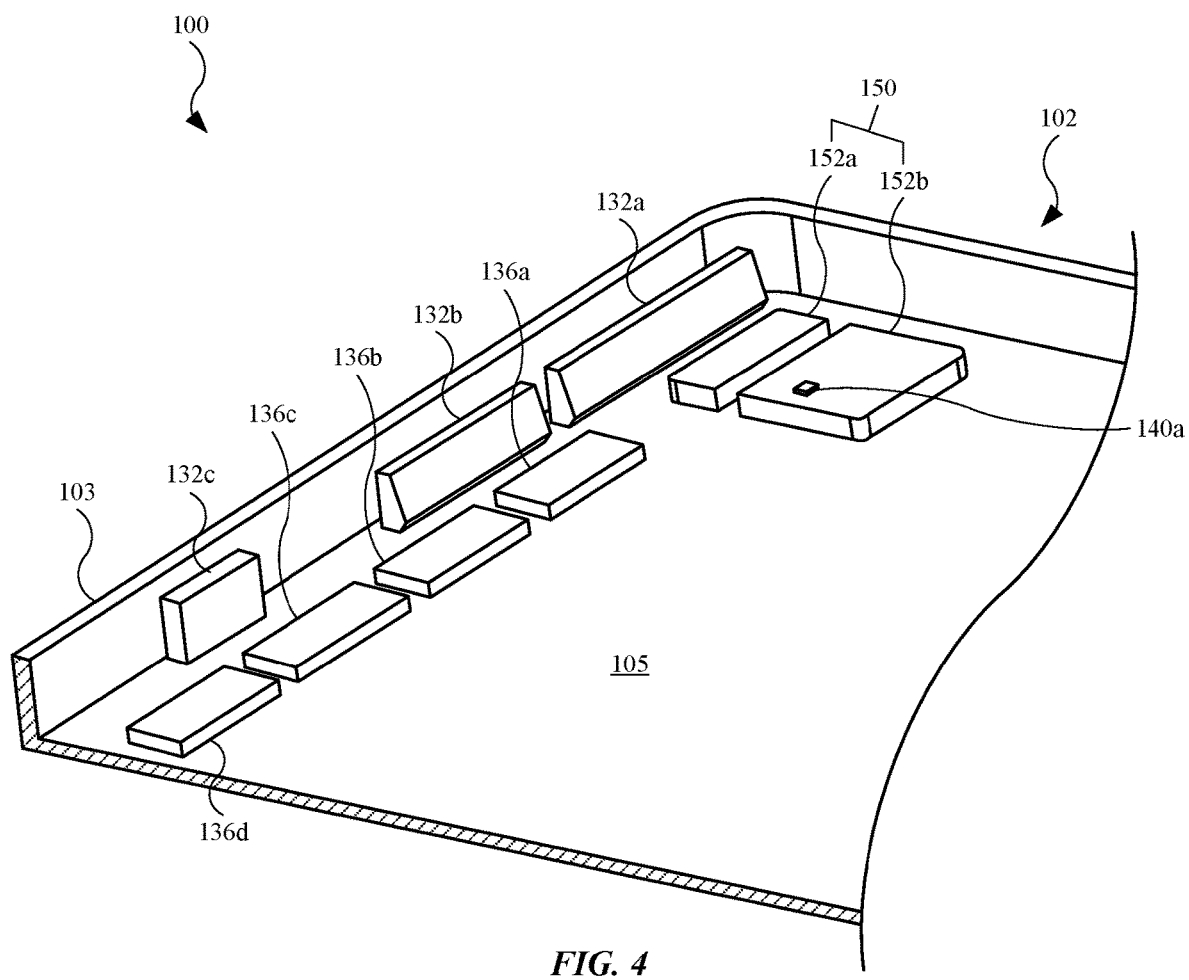
FIG. 4 illustrates an isometric view of the electronic device, showing the layout of several magnets and the shunt assembly.

FIG. 4 illustrates an isometric view of electronic device 100, showing the layout of several magnets and shunt assembly 150. In addition to magnet 132a, electronic device 100 includes a magnet 132b and a magnet 132c used to secure electronic device 100 to an accessory device (not shown in FIG. 5) along sidewall 103 of enclosure 102. Further, in addition to magnet 136a, electronic device 100 includes a magnet 136b, a magnet 136c, and a magnet 136d used to secure electronic device 100 to an accessory device (not shown in FIG. 5) along bottom wall 105 of enclosure 102.

As shown, sensor 140a is positioned in proximity to magnet 132a, and would otherwise detect the magnetic field from magnet 132a. In other words, magnet 132a can generate a magnetic field capable of triggering sensor 140a, i.e., magnet 132a can provide a magnetic field at or above a threshold magnetic field required to trigger sensor 140a. However, shunt assembly 150 sufficiently minimizes the magnetic field from magnet 132a (as well as other magnets in electronic device 100 that could be detected by sensor 140a) such that the magnitude of the magnetic field is below a threshold magnetic field required to trigger sensor 140a.

Figure 5:
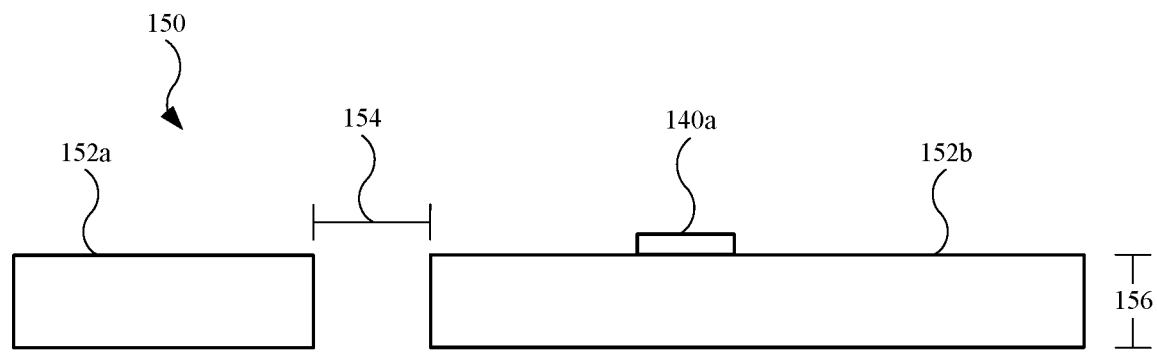
FIG. 5 illustrates a side view of the shunt assembly and the sensor.

FIG. 5 illustrates a side view of shunt assembly 150 and sensor 140a, in accordance with some described embodiments. As shown, shunt elements 152a and 152b are separated by a gap 154. Gap 154 may be approximately in the range of 0.10 to 0.25 millimeters ("mm"). In some embodiments, gap 154 is 0.15 mm. Gap 154 provides resistance against magnetic flux provided by a magnet, such as magnet 132a (shown in FIG. 4). In this manner, any magnetic flux provided by a magnet is not only reduced by shunt element 152a, but also by the air space defined by gap 154.

Also, shunt assembly 150 (defined by the shunt element 152a and the shunt element 152b) may include a dimension 156, or thickness. Dimension 156 may be approximately in the range of 0.50 to 2.0 mm. Shunt assembly 150, having dimension 156, provides a relatively decreased reluctance (as compared to shunts having a dimension less than dimension 156). In this manner, magnetic flux from a magnet external to electronic device 100 (shown in FIG. 4) can more readily pass through shunt element 152b, thereby placing magnetic field in proximity to sensor 140a so that sensor 140a can more easily detect the magnetic field. This will be shown below.

Figure 6:
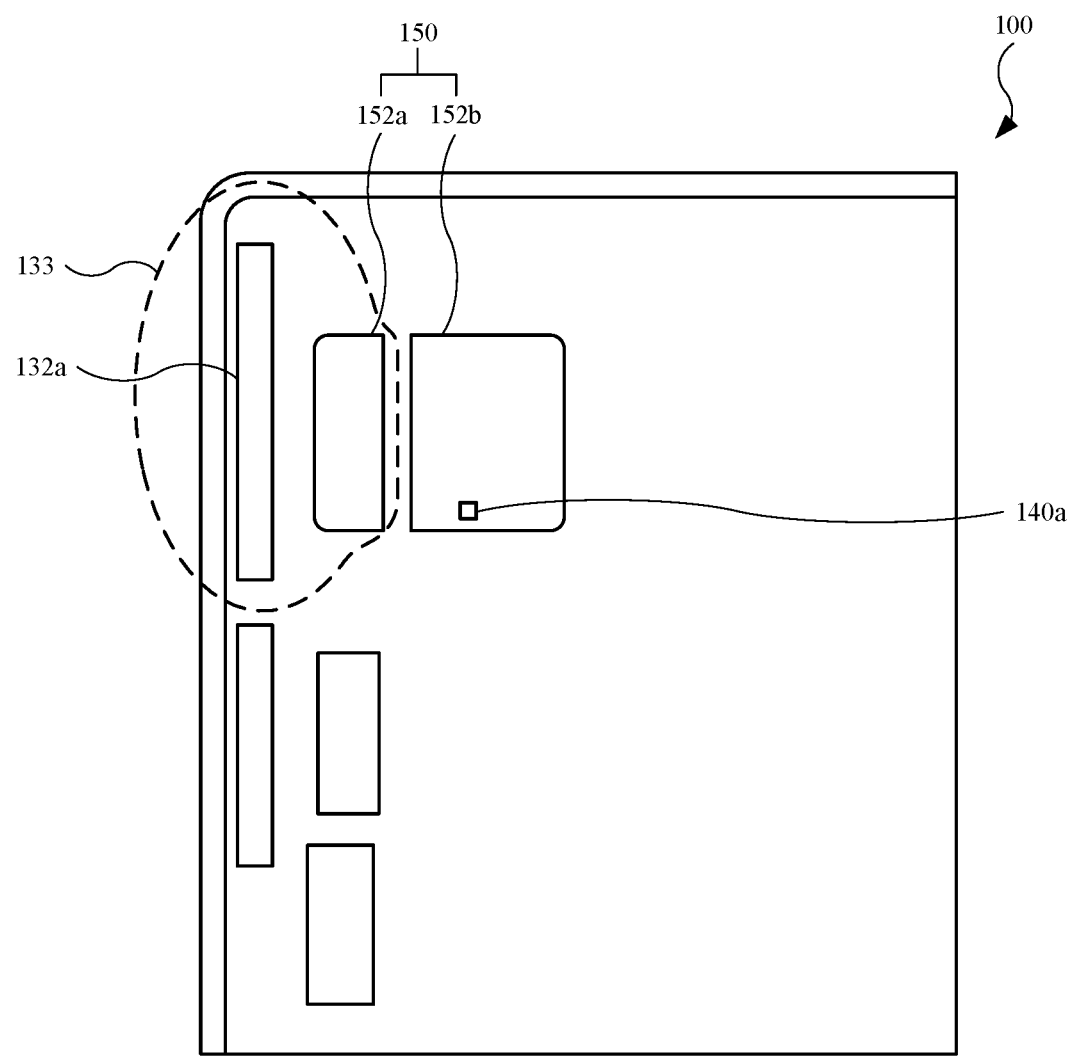
FIG. 6 illustrates a plan view of the electronic device, showing the shunt assembly altering the magnetic flux provided by the magnet.

FIG. 6 illustrates a plan view of electronic device 100, showing shunt assembly 150 altering the magnetic flux provided by magnet 132a. A dotted line 133 defines a boundary to which the magnetic flux of magnet 132a extends. Based on the location of shunt assembly 150 and the placement of the sensor 140a on shunt assembly 150, the magnetic flux provided by magnet 132a does not reach the sensor 140a. In other words, the threshold magnetic field required for sensor 140a to detect a magnet is not met. This is due in part to the position of shunt element 152a between magnet 132a and sensor 140a, as well as gap 154 (labeled in FIG. 5).

Figure 7:
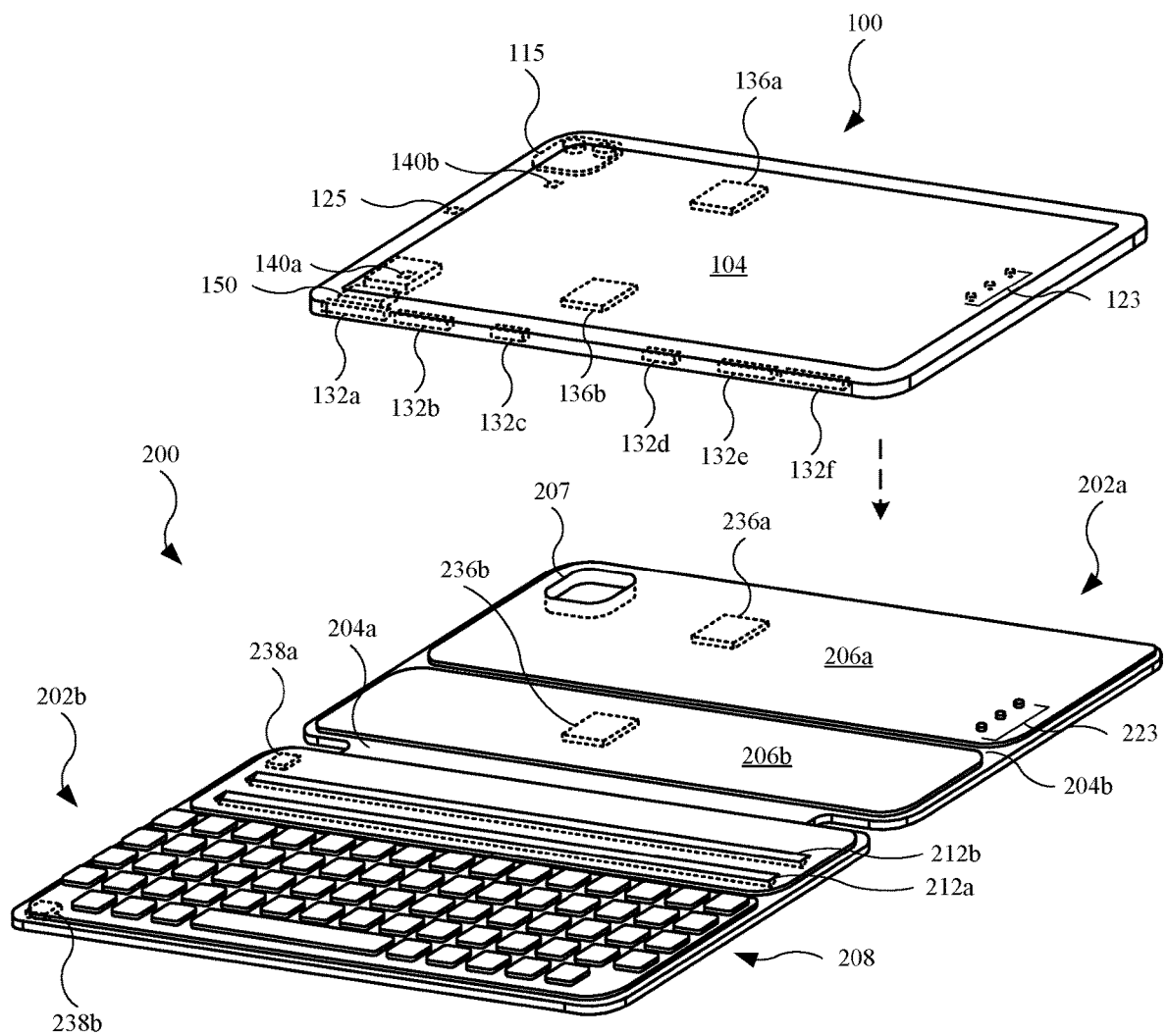
FIG. 7 illustrates an isometric view of the electronic device and an accessory device suitable for use with the electronic device, in accordance with some described embodiments.

FIG. 7 illustrates an isometric view of electronic device 100 and an accessory device 200 suitable for use with electronic device 100, in accordance with some described embodiments. Accessory device 200 is designed as a complementary device for electronic device 100. As shown, accessory device 200 may include a first section 202a and a second section 202b rotationally connected to first section 202a by a hinge 204a. First section 202a defines a receiving surface for electronic device 100. First section 202a includes a first segment 206a and a second segment 206b rotationally connected to first segment 206a by a hinge 204b. In order to secure electronic device 100 with accessory device 200 at first section 202a, electronic device 100 includes a magnet 136a and a magnet 136b that magnetically couple with a magnet 236a (in the first segment 206a) and a magnet 236b (in second segment 206b), respectively. Further, first section 202a includes an opening 207 to enable camera assembly 115 to capture images through first section 202a.

Second section 202b may include a keyboard 208 that includes several keys (not labeled) arranged in a QWERTY configuration, as a non-limiting example. In order for electronic device 100 to communicate with keyboard 208, first section 202a includes contacts 223 that electrically couple with contacts 123 of electronic device 100. Also, second section 202b may further include one or more channels designed to provide sub-flush regions to receive electronic device 100. For example, second section 202b may include a first channel 212a and a second channel 212b, each of which is designed to receive electronic device 100 (or a portion of electronic device 100) in order to position electronic device 100 in a manner such that electronic device 100 (and in particular, display assembly 104) can be used with keyboard 208. In order to maintain electronic device 100 within first channel 212a or the second channel 212b, several magnets (not shown in FIG. 7) are embedded in second section 202b and magnetically couple with magnets 132a, 132b, 132c, as well as a magnet 132d, a magnet 132e, and a magnet 132f of electronic device 100.

Second section 202b can rotate relative to first section 202a and cover display assembly 104. In order to remain secured over display assembly 104, second section 202b may include additional magnets (not shown in FIG. 7) designed to magnetically couple with additional magnets (not shown in FIG. 7) in electronic device 100. Moreover, in order for electronic device 100 to determine whether second section 202b of accessory device 200 is covering display assembly 104, the sensors 140a and 140b can detect a magnet 238a and a magnet 238b, respectively, when second section 202b covers/overlays display assembly 104. While shunt assembly 150 reduces (or prevents) the magnetic flux from magnet 132a from being detected by sensor 140a, shunt assembly 150 does not prohibit the magnetic flux from magnet 238a from reaching the sensor 140a. As a result, magnet 238a provides a magnetic field (at sensor 140a) that is at or above the threshold magnetic field required to trigger the sensor 140a. In this manner, sensor 140a generates an electrical signal indicating magnet 238a is detected. When each of sensors 140a and 140b generates an electrical signal, electronic device 100 uses the respective electrical signals to determine display assembly 104 is covered by second section 202b of accessory device 200, and deactivates display assembly 104. Furthermore, electronic device 100 can disable microphone 125 based on the electrical signals provided by sensor 140a. This will be shown and described below.

Figure 8:
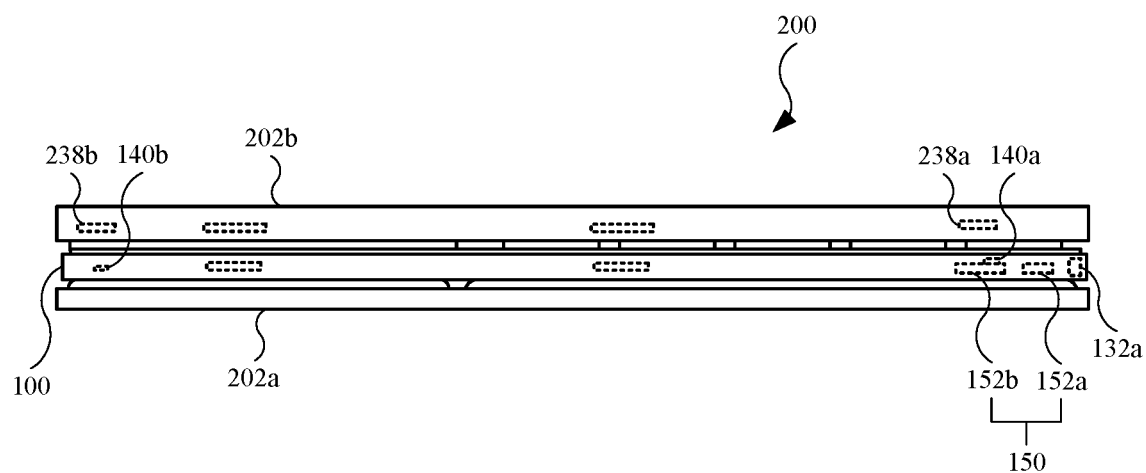
FIG. 8 illustrates a side view of the electronic device and the accessory device shown in FIG. 7, showing the accessory device covering the electronic device.

FIG. 8 illustrates a side view of electronic device 100 and accessory device 200 shown in FIG. 7, showing accessory device 200 covering electronic device 100. As shown, first section 202a covers a rear portion of electronic device 100, while second section 202b covers a front portion of electronic device 100. When electronic device 100 is covered by accessory device 200, accessory device 200 may define a closed position. In the closed position, the magnetic field from magnet 238a in second section 202b is detected by sensor 140a, and the magnetic field from magnet 238b in second section 202b can be detected by sensor 140b. Further, shunt element 152b of shunt assembly 150 does not impede the magnetic flux from magnet 238a in accessory device 200, while shunt element 152a of shunt assembly 150 impedes the magnetic flux from magnet 132a in electronic device 100.

Figure 9:
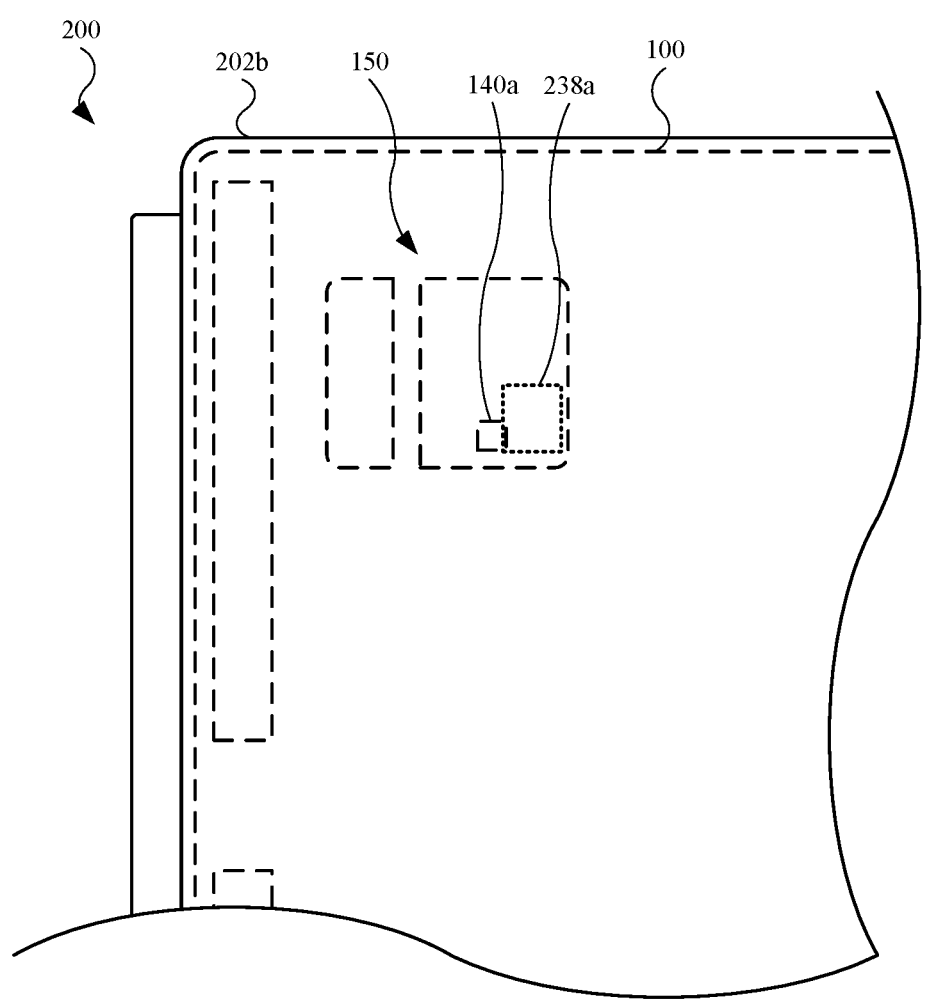
FIG. 9 illustrates a plan view of the electronic device and the accessory device in the closed position (shown in FIG. 8), showing the relationship between the magnet of the accessory device and the sensor of the electronic device.

FIG. 9 illustrates a plan view of electronic device 100 and accessory device 200 in the closed position (shown in FIG. 8), showing the relationship between magnet 238a of accessory device 200 and sensor 140a of electronic device 100. As shown, second section 202b is covering the front portion of electronic device 100. Generally, second section 202b is directly over electronic device 100. However, magnet 238a is offset (or not directly over) sensor 140a. Magnet 238a is nonetheless detected by sensor 140a, due in part to shunt assembly 150.

Figure 10:
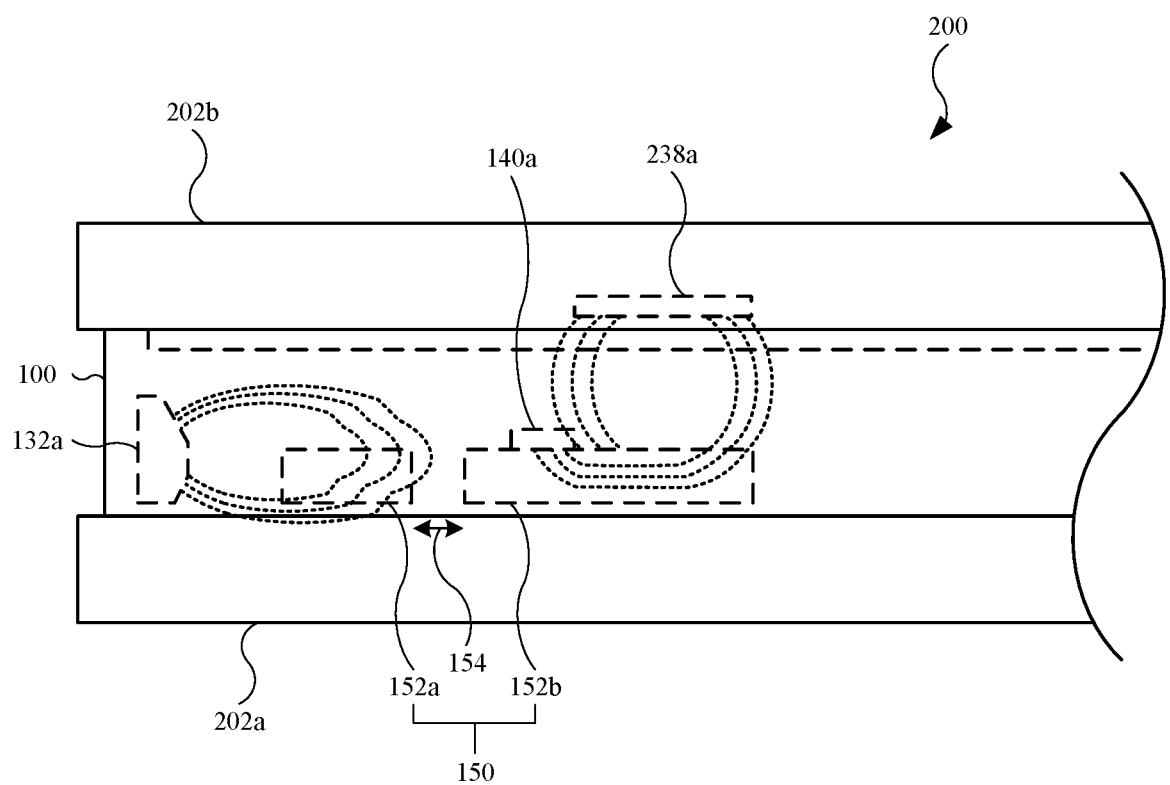
FIG. 10 illustrates a side view of the electronic device and the accessory device in the closed position (shown in FIG. 8), showing the sensor detecting the magnet in the accessory device.

FIG. 10 illustrates a side view of electronic device 100 and accessory device 200 in the closed position (shown in FIG. 8), showing sensor 140a detecting magnet 238a in accessory device 200. As shown, shunt assembly 150 facilitates the magnetic flux of magnet 238a by allowing the magnet flux to pass through shunt element 152b in a manner in which sensor 140a can detect the magnetic flux. Conversely, shunt assembly 150 impedes the magnetic flux of magnet 132a by absorbing, through shunt element 152a, and providing, by gap 154, additional resistance to the magnetic flux. Accordingly, sensor 140a can distinguish between magnet 238a and magnet 132a. In particular, sensor 140a can distinguish between the magnetic field provided by magnet 238a and the magnetic field provided by magnet 132a such that sensor 140a is only triggered by the magnetic field provided by magnet 238a. Accordingly, the magnitude, as determined by sensor 140a, of the magnetic field of magnet 238a is greater than that of magnet 132a. In other words, the magnitude of the magnetic field of magnet 238a is greater than that of magnet 132a at a location corresponding to the location of sensor 140a. It should be noted that the position of sensor 140a relative to magnet 132a would otherwise allow sensor 140a to detect the magnetic field from magnet 132a without the integration of shunt assembly 150.

Shunt assembly 150 can act as a filter, including a magnetic field filter, for sensor 140a, by reducing the magnetic flux from magnet 132a, thereby increasing the signal-to-noise ratio ("SNR") and increasing the likelihood of proper detection of a magnetic field by sensor 140a. Moreover, the facilitation by shunt assembly 150 of magnetic flux from magnet 238a to sensor 140a may also increase the SNR. Accordingly, the reduction of the magnetic flux from magnet 132a coupled with the facilitation of the magnet flux from magnet 238a can also improve the SNR. In this manner, the difference between the lowest trigger value (corresponding to the lowest magnitude of magnetic field detected by sensor 140a) and the greatest non-triggering value (corresponding to the highest magnitude of magnetic field that is not detected by sensor 140a) is greater, corresponding to an increase in the likelihood of less "false triggers," i.e., detection of magnetic fields by sensor 140a other than the desired magnetic field.

Figure 11:
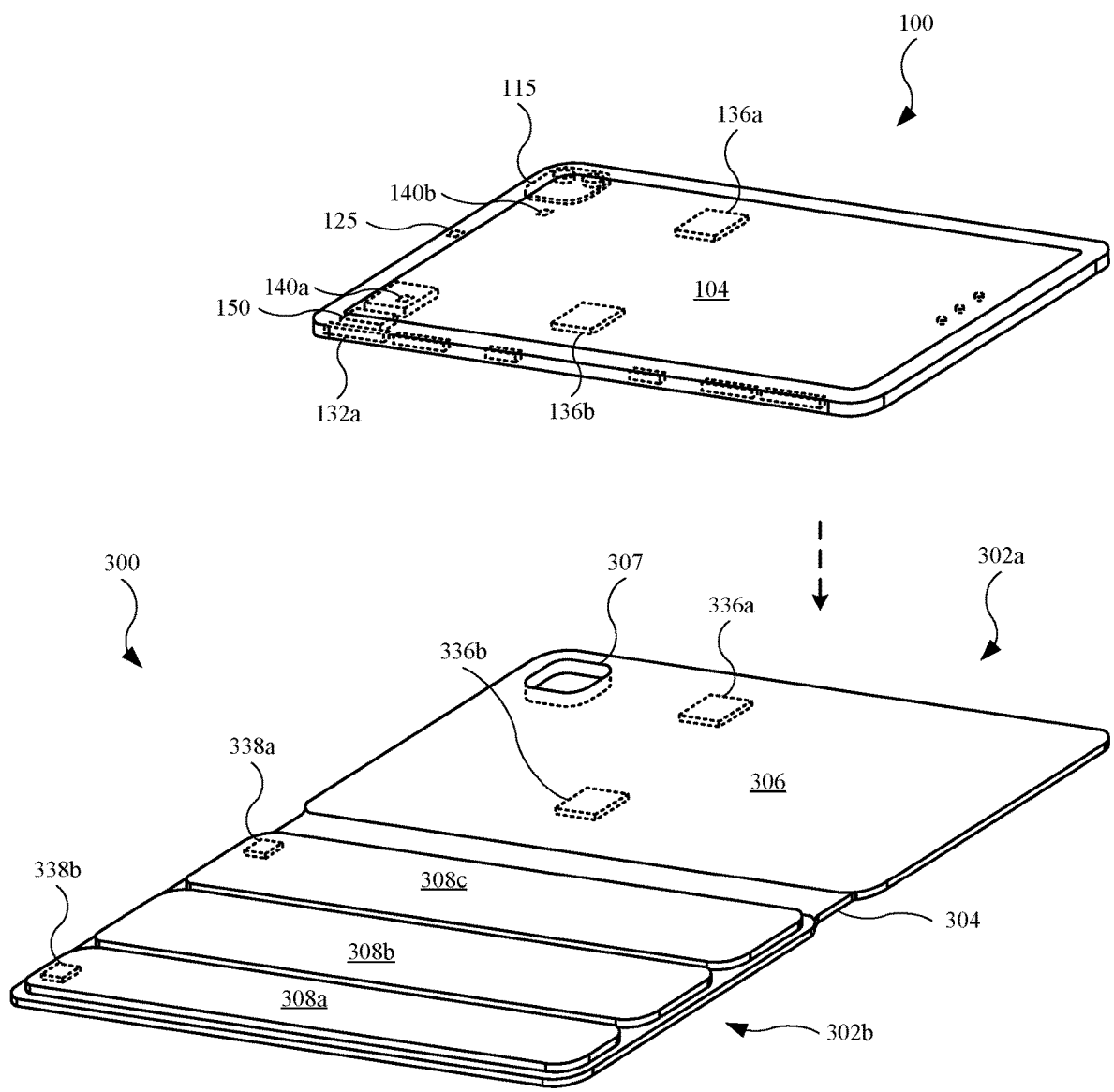
FIG. 11 illustrates an isometric view of the electronic device and an alternate embodiment of an accessory device suitable for use with the electronic device.

FIG. 11 illustrates an isometric view of electronic device 100 and an alternate embodiment of an accessory device 300 suitable for use with electronic device 100. Accessory device 300 is designed as yet another complementary device for electronic device 100. As shown, accessory device 300 includes a first section 302a rotationally coupled to a second section 302b by a hinge 304. First section 302a may define a back cover or back panel for electronic device 100. Also, first section 302a may define a receiving surface 306 that receives a rear portion of electronic device 100. In order to secure electronic device 100 with accessory device 300 at first section 302a, electronic device 100 includes a magnet 136a and a magnet 136b that magnetically couple with a magnet 336a and a magnet 336b, respectively, of first section 302a. Further, first section 302a includes an opening 307 to enable camera assembly 115 to capture images through first section 302a.

Second section 302b is designed to wrap around and cover electronic device 100, including display assembly 104. In this manner, second section 302b may be referred to as a front panel or front cover. Second section 302b may include multiple segments. For example, second section 302b may include a first segment 308a, a second segment 308b, and a third segment 308c. Each segment is rotatable or moveable with respect to the remaining segments. Also, while a discrete number of segments are shown, the number of segments may vary in other embodiments.

In order to remain secured over display assembly 104, second section 302b may include additional magnets (not shown in FIG. 11) designed to magnetically couple with additional magnets (not shown in FIG. 11) in electronic device 100. Moreover, in order for electronic device 100 to determine whether second section 302b of accessory device 300 is covering display assembly 104, sensors 140a and sensor 140b can detect a magnet 338a and a magnet 338b, respectively, when second section 302b covers/overlays display assembly 104. In a manner similar to a prior embodiment, shunt assembly 150 reduces (or prevents) the magnetic flux from magnet 132a from being detected by sensor 140a, but does not prohibit the magnetic flux from magnet 338a from reaching sensor 140a. As a result, magnet 338a provides a magnetic field (at sensor 140a) that is at or above the threshold magnetic field required to trigger sensor 140a. Also, when each of sensors 140a and 140b generates an electrical signal, electronic device 100 uses the respective electrical signals to determine display assembly 104 is covered by second section 302b of accessory device 300, and deactivates display assembly 104.

Figure 12:
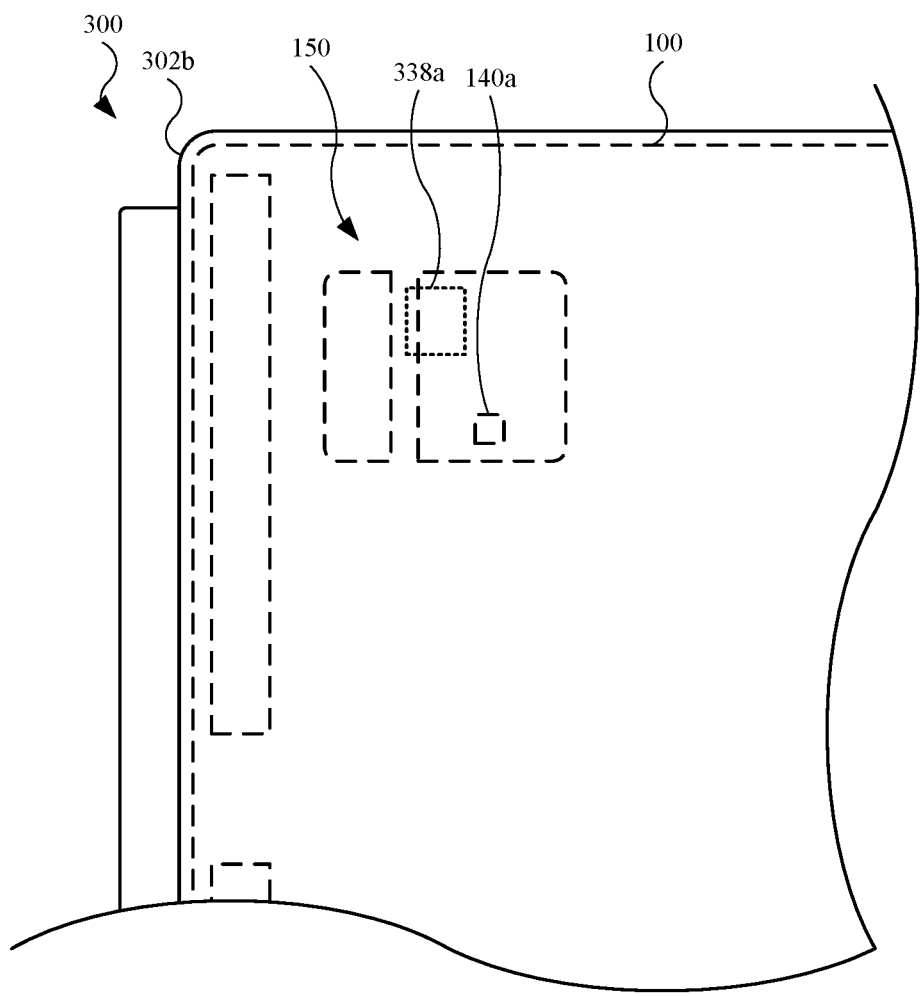
FIG. 12 illustrates a plan view of the electronic device and the accessory device in a closed position, showing the relationship between the magnet of the accessory device and the sensor of the electronic device.

FIG. 12 illustrates a plan view of electronic device 100 and accessory device 300 in the closed position, showing the relationship between magnet 338a of accessory device 300 and sensor 140a of electronic device 100. The "closed position" refers to a position similar to what is shown in FIG. 8. As shown, second section 302b is covering the front portion of electronic device 100. Generally, second section 302b is directly over electronic device 100. However, magnet 338a is offset (or not directly over) sensor 140a. Moreover, the offset position is different from the offset position shown in FIG. 9 between magnet 238a and sensor 140a. Magnet 338a is nonetheless detected by sensor 140a, due in part to shunt assembly 150.

Figure 13:
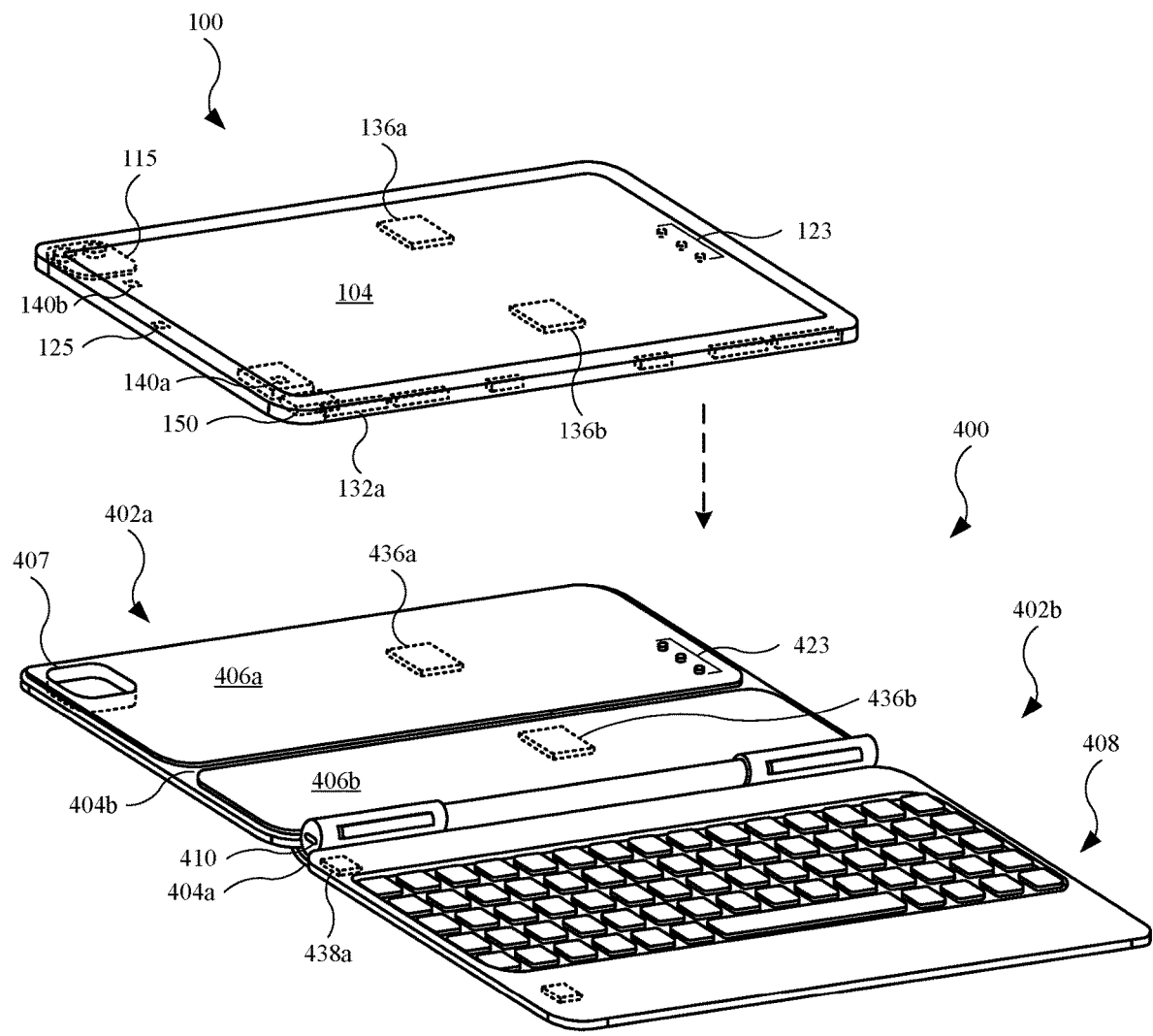
FIG. 13 illustrates an isometric view of the electronic device and an alternate embodiment of an accessory device suitable for use with the electronic device.

FIG. 13 illustrates an isometric view of electronic device 100 and an alternate embodiment of an accessory device 400 suitable for use with electronic device 100. Accessory device 400 is designed as yet another complementary device for electronic device 100. As shown, accessory device 400 includes a first section 402a and a second section 402b rotationally coupled to first second by a hinge 404a. First section 402a includes a first segment 406a and a second segment 406b rotationally coupled to first segment 406a by a hinge 404b. In order to secure electronic device 100 with accessory device 400 at first section 402a, electronic device 100 includes a magnet 136a and a magnet 136b that magnetically couple with a magnet 436a (in first segment 406a) and a magnet 436b (in second segment 406b), respectively. Further, first section 202a includes an opening 407 to enable camera assembly 115 to capture images through first section 402a.

Second section 402b may include a keyboard 408 that includes several keys (not labeled) arranged in a QWERTY configuration, as a non-limiting example. In order for electronic device 100 to communicate with keyboard 408, first section 402a includes contacts 423 that electrically couple with contacts 123 of electronic device 100. Also, first section 402a is designed to provide a support structure that carries, supports, and suspends electronic device 100 so that electronic device 100 is not in contact with second section 402b, and electronic device 100 and keyboard 408 are both viewable by a user. Additionally, in order to charge electronic device 100, accessory device 400 includes a port 410 designed to receive a connector (not shown in FIG. 13) that provides electrical energy to electronic device 100, via contacts 423 and contacts 123, to charge a power supply (not shown in FIG. 13) of electronic device 100.

In an alternate configuration, second section 402b can rotate relative to first section 402a and cover display assembly 104. In order to remain secured over display assembly 104, second section 402b may include additional magnets (not shown in FIG. 13) designed to magnetically couple with additional magnets (not shown in FIG. 13) in electronic device 100. In a manner similar to prior embodiments, shunt assembly 150 reduces (or prevents) the magnetic flux from magnet 132a from being detected by sensor 140a, shunt assembly 150 reduces (or prevents) the magnetic flux from magnet 132a from being detected by sensor 140a, but does not prohibit the magnetic flux from magnet 438a from reaching sensor 140a. As a result, magnet 438a provides a magnetic field (at sensor 140a) that is at or above the threshold magnetic field required to trigger sensor 140a. Also, when each of sensors 140a and 140b generates an electrical signal, electronic device 100 uses the respective electrical signals to determine display assembly 104 is covered by second section 402b of accessory device 400, and deactivates display assembly 104.

Figure 14:
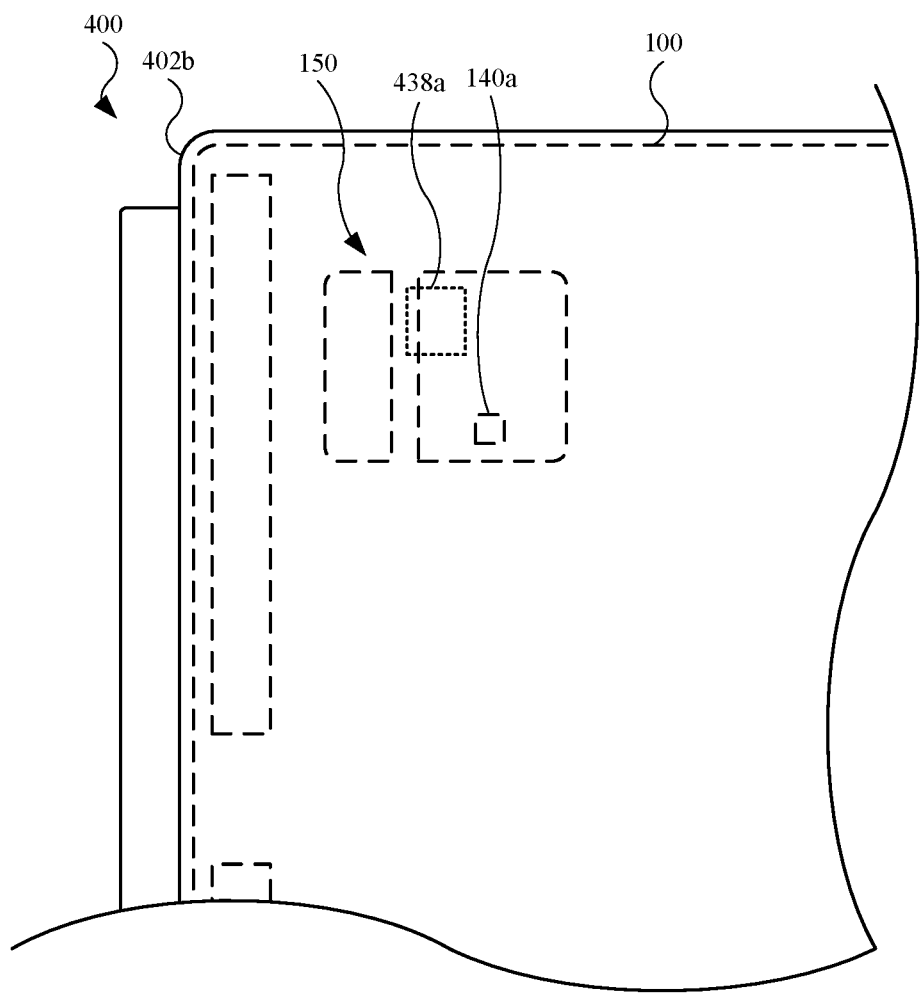
FIG. 14 illustrates a plan view of the electronic device and the accessory device in a closed position, showing the relationship between the magnet of the accessory device and the sensor of the electronic device.

FIG. 14 illustrates a plan view of electronic device 100 and accessory device 400 in the closed position, showing the relationship between magnet 438a of accessory device 400 and sensor 140a of electronic device 100. The "closed position" refers to a position similar to what is shown in FIG. 8. As shown, second section 402b is covering the front portion of electronic device 100. Generally, second section 402b is directly over electronic device 100. However, magnet 438a is offset (or not directly over) sensor 140a. Moreover, the offset position is different from the offset position shown in FIG. 9 between magnet 438a and sensor 140a, and also different from the offset position shown in FIG. 12 between magnet 338a and sensor 140a. Magnet 438a may nonetheless be detected by sensor 140a.

The foregoing embodiments show that based on the integration of shunt assembly 150, sensor 140a need not be directly aligned along a particular axis with respect to a magnet to be detected by sensor 140a. As a result, electronic device 100 is compatible with at least three accessory devices, each with a magnet that can be detected by sensor 140a, while these magnets are in different offset positions. It should be noted, however, that sensor 140a can detect magnets in direct alignment (i.e., along a single axis) with respect to sensor 140a.

Also, the aforementioned accessory devices include a magnet, or triggering magnet, designed to trigger a sensor (e.g., magnetic field sensor) in electronic device 100. Based on empirical data, the lowest magnitude (in absolute value) of the magnetic flux that triggered the sensor 140a ranged from 23.7 Millitesla ("mT") to 68.9 mT, while the greatest release value (or un-triggering value) ranged from 8.1 mT to 0.1 mT. When compared to data in which a shunt assembly was not used, the difference between the lowest magnitude that triggered the sensor and the greatest release value was significantly less. Accordingly, the shunt assembly provides a virtual hysteresis that can prevent the sensor from false triggering.

FIGS. 15-18 show and describe various modifications to shunt assemblies. The shunt assemblies shown and described in FIGS. 15-18 may substitute for shunt assembly 150 (previously shown).

Figure 15:
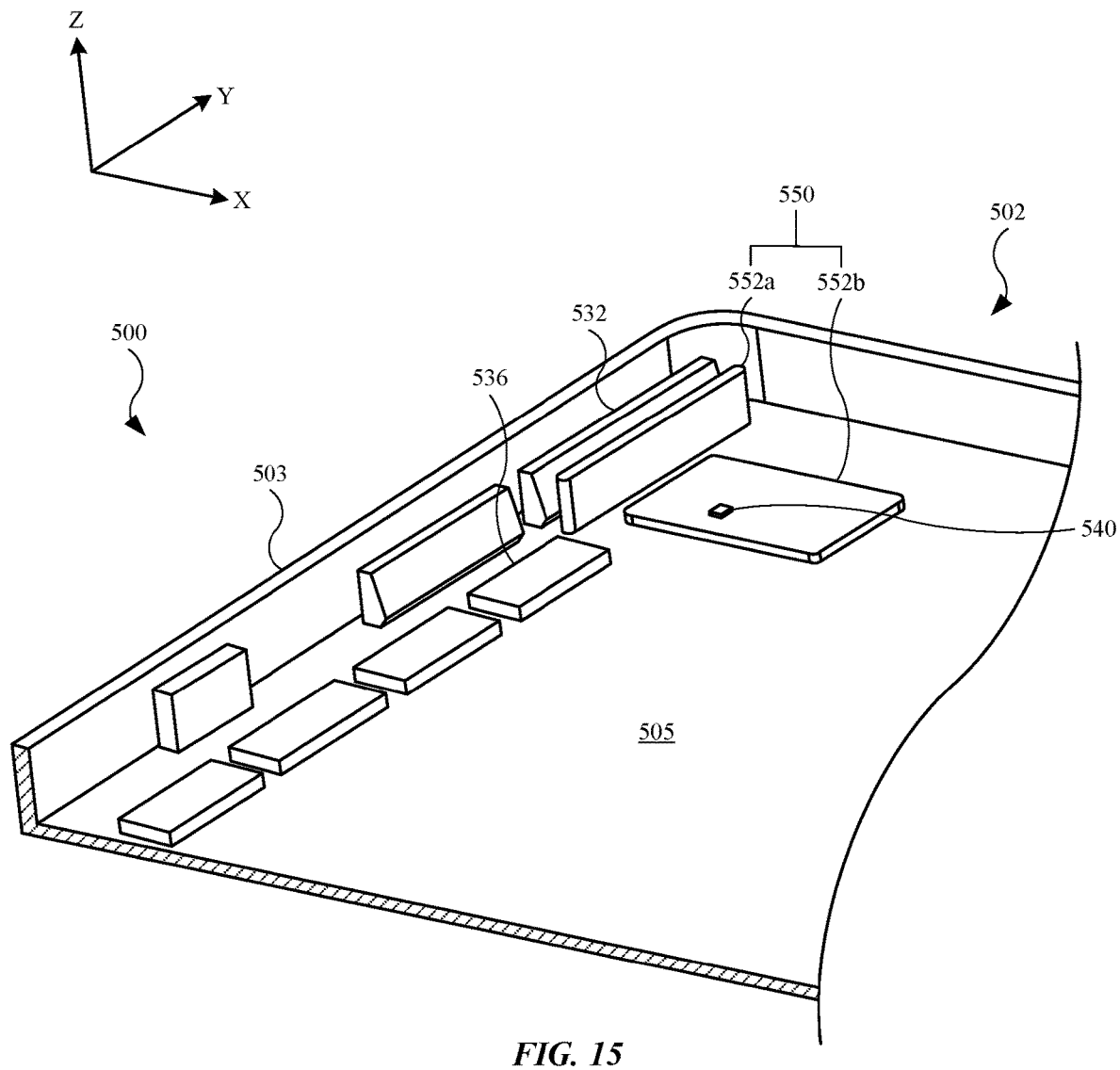
FIG. 15 illustrates an isometric view of an alternate embodiment of an electronic device, showing an alternate layout of a shunt assembly.

FIG. 15 illustrates an isometric view of an alternate embodiment of an electronic device 500, showing an alternate layout of a shunt assembly 550. Electronic device 500 may include several features previously shown and described for electronic device 100 (shown in FIG. 1). As shown, electronic device 500 includes a magnet 532 (representative of additional, unlabeled magnets) used to secure electronic device 500 to an accessory device (not shown in FIG. 15) along a sidewall 503 of enclosure 502. Further, electronic device 500 may include a magnet 536 (representative of additional, unlabeled magnets) used to secure electronic device 500 to an accessory device (not shown in FIG. 15) along a bottom wall 505 of enclosure 502.

Shunt assembly 550 includes a shunt element 552a and a shunt element 552b separated by a gap (not labeled; similar to gap 154 shown in FIG. 5). Shunt element 552a may include a dimension (i.e., major length) that is the same as, or substantially similar to, a dimension (i.e., major length) of magnet 532. For example, as shown, magnet 532 and shunt element 552a includes the same or similar dimension along the Y-axis. Additionally, magnet 532 and shunt element 552a includes the same or similar dimension along the Z-axis. This may facilitate installation of magnet 532 and shunt element 552a in electronic device 500. Further, magnet 532 and shunt element 552a may be secured together by an adhesive, as a non-limiting example.

As shown, sensor 540 is positioned in proximity to magnet 532, and would otherwise detect the magnetic field from magnet 532. However, shunt assembly 550 sufficiently minimizes the magnetic field from magnet 532 (as well as other magnets in electronic device 500 that could potentially be detected by sensor 540) such that magnet 532 (as well as any other magnet in electronic device 500) does not provide a magnetic field at or above the threshold magnetic field required to trigger sensor 540.

Figure 16:
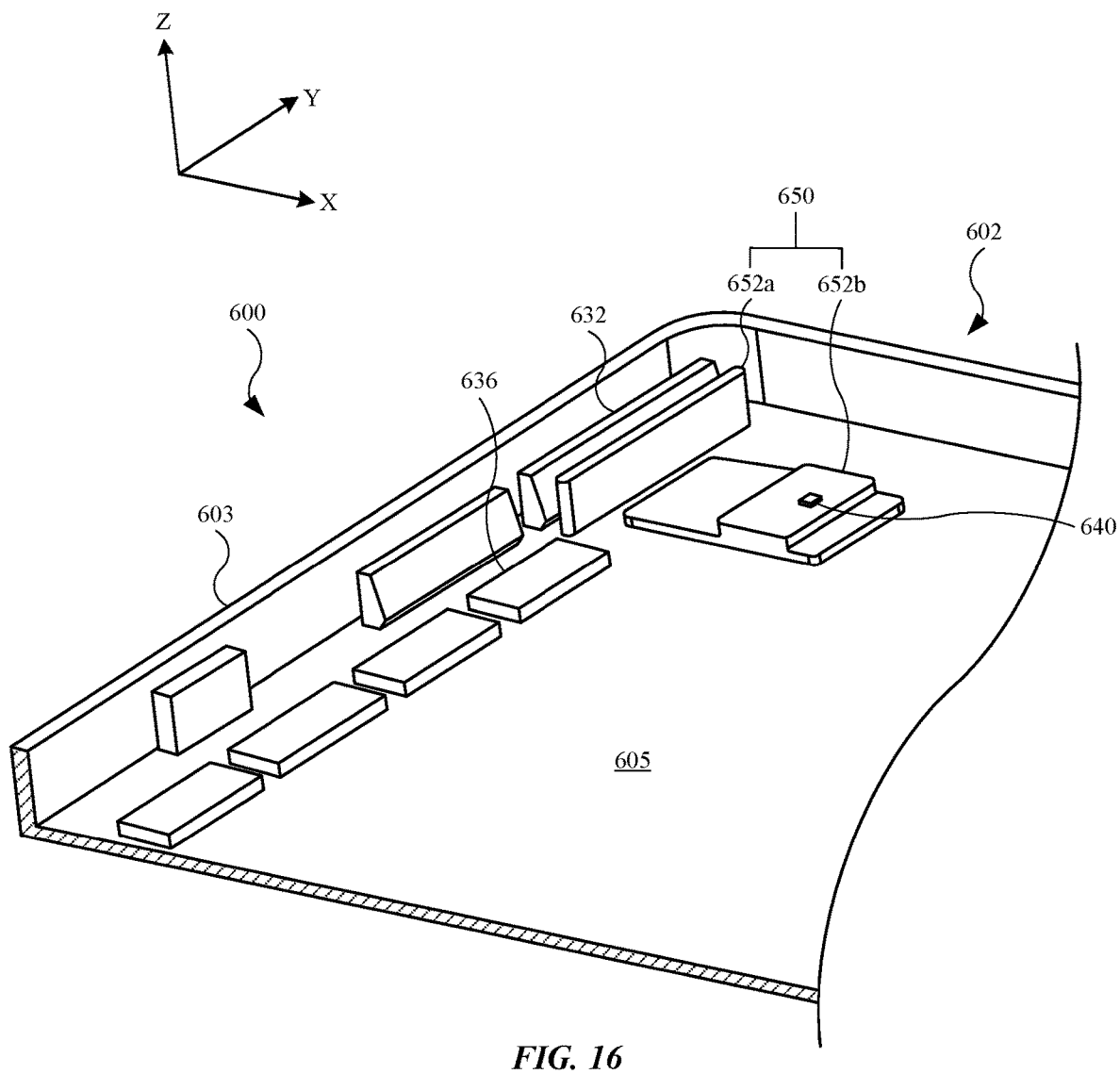
FIG. 16 illustrates an isometric view of an alternate embodiment of an electronic device, showing an alternate layout of a shunt assembly.

FIG. 16 illustrates an isometric view of an alternate embodiment of an electronic device 600, showing an alternate layout of a shunt assembly 650. Electronic device 600 may include several features previously shown and described for electronic device 100 (shown in FIG. 1). As shown, electronic device 600 includes a magnet 632 (representative of additional, unlabeled magnets) used to secure electronic device 600 to an accessory device (not shown in FIG. 16) along a sidewall 603 of the enclosure 602. Further, electronic device 600 may include a magnet 636 (representative of additional, unlabeled magnets) used to secure electronic device 600 to an accessory device (not shown in FIG. 16) along a bottom wall 605 of enclosure 602.

Shunt assembly 650 includes a shunt element 652*a* and a shunt element 652*b* separated by a gap (not labeled; similar to gap 154 shown in FIG. 5). Shunt element 652*a* may include a dimension (i.e., major length) that is the same as, or substantially similar to, a dimension (i.e., major length) of magnet 632. For example, as shown, magnet 632 and shunt element 652*a* includes the same or similar dimension along the Y-axis. Additionally, magnet 632 and shunt element 652*a* includes the same or similar dimension along the Z-axis. This may facilitate installation of magnet 632 and shunt element 652*a*. Further, magnet 632 and shunt element 652*a* may be secured together by an adhesive, as a non-limiting example. Shunt element 652*b* may include a stepped structure, which may include a single, monolithic piece or two pieces secured together. Shunt element 652*b* can direct the magnetic field in a certain desired manner. For example, shunt element 652*b* may direct the magnetic field in a relatively uniform manner, thereby providing increased predictability as to the location of the magnetic field as directed by shunt element 652*b*.

As shown, sensor 640 is positioned in proximity to magnet 632, and would otherwise detect the magnetic field from magnet 632. However, shunt assembly 650 sufficiently minimizes the magnetic field from the magnet 632 (as well as other magnets in electronic device 600 that could potentially be detected by sensor 640) such that magnet 632 (as well as any other magnet in electronic device 600) does not provide a magnetic field at or above the threshold magnetic field required to trigger sensor 640.

Figure 17:
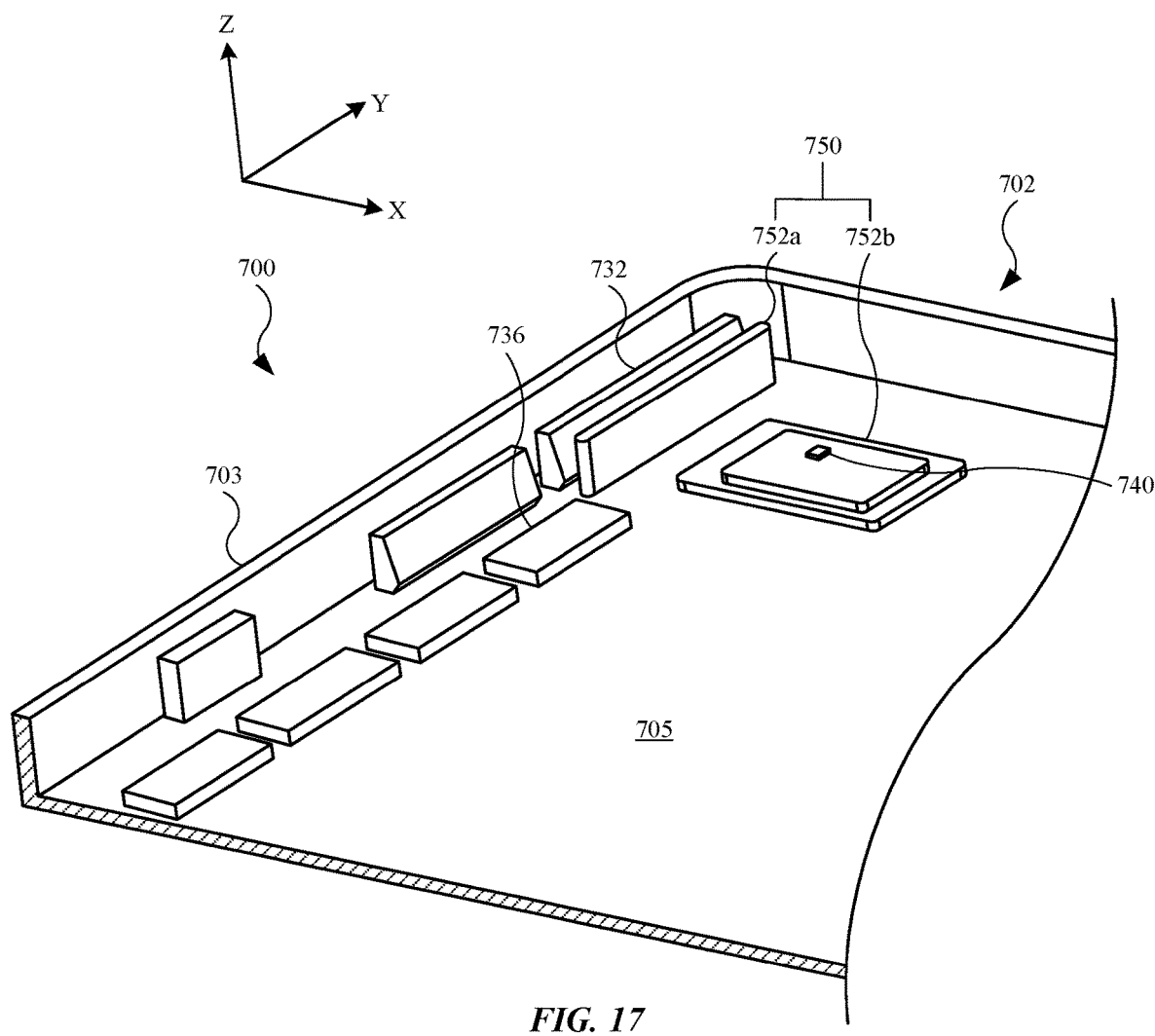
FIG. 17 illustrates an isometric view of an alternate embodiment of an electronic device, showing an alternate layout of a shunt assembly.

FIG. 17 illustrates an isometric view of an alternate embodiment of an electronic device 700, showing an alternate layout of a shunt assembly 750. Electronic device 700 may include several features previously shown and described for electronic device 100 (shown in FIG. 1). As shown, electronic device 700 includes a magnet 732 (representative of additional, unlabeled magnets) used to secure electronic device 700 to an accessory device (not shown in FIG. 17) along a sidewall 703 of enclosure 702. Further, electronic device 700 may include a magnet 736 (representative of additional, unlabeled magnets) used to secure electronic device 700 to an accessory device (not shown in FIG. 17) along a bottom wall 705 of enclosure 702.

Shunt assembly 750 includes a shunt element 752*a* and a shunt element 752*b* separated by a gap (not labeled). Shunt element 752*a* may include a dimension (i.e., major length) that is the same as, or substantially similar to, a dimension (i.e., major length) of magnet 732. For example, as shown, magnet 732 and shunt element 752*a* includes the same or similar dimension along the Y-axis. Additionally, magnet 732 and shunt element 752*a* includes the same or similar dimension along the Z-axis. This may facilitate installation of magnet 732 and shunt element 752*a*. Further, magnet 732 and shunt element 752*a* may be secured together by an adhesive, as a non-limiting example. Shunt element 752*b* may include a stepped structure, which may include two pieces separated by a gap. The gap may be defined by an adhesive, as a non-limiting example. Accordingly, shunt element 752*b* may be referred to as a shunt sub-assembly. Also, the gap between the two pieces of shunt element 752*b* may limit or prevent magnetic flux from passing through the lower shunt part to the upper shunt part (on which sensor 740 is located).

As shown, sensor 740 is positioned in proximity to magnet 732, and would otherwise detect the magnetic field from magnet 732. However, shunt assembly 750 sufficiently minimizes the magnetic field from magnet 732 (as well as other magnets in electronic device 700 that could potentially be detected by sensor 740) such that magnet 732 (as well as any other magnet in electronic device 700) does not provide a magnetic field at or above the threshold magnetic field required to trigger sensor 740.

Figure 18:
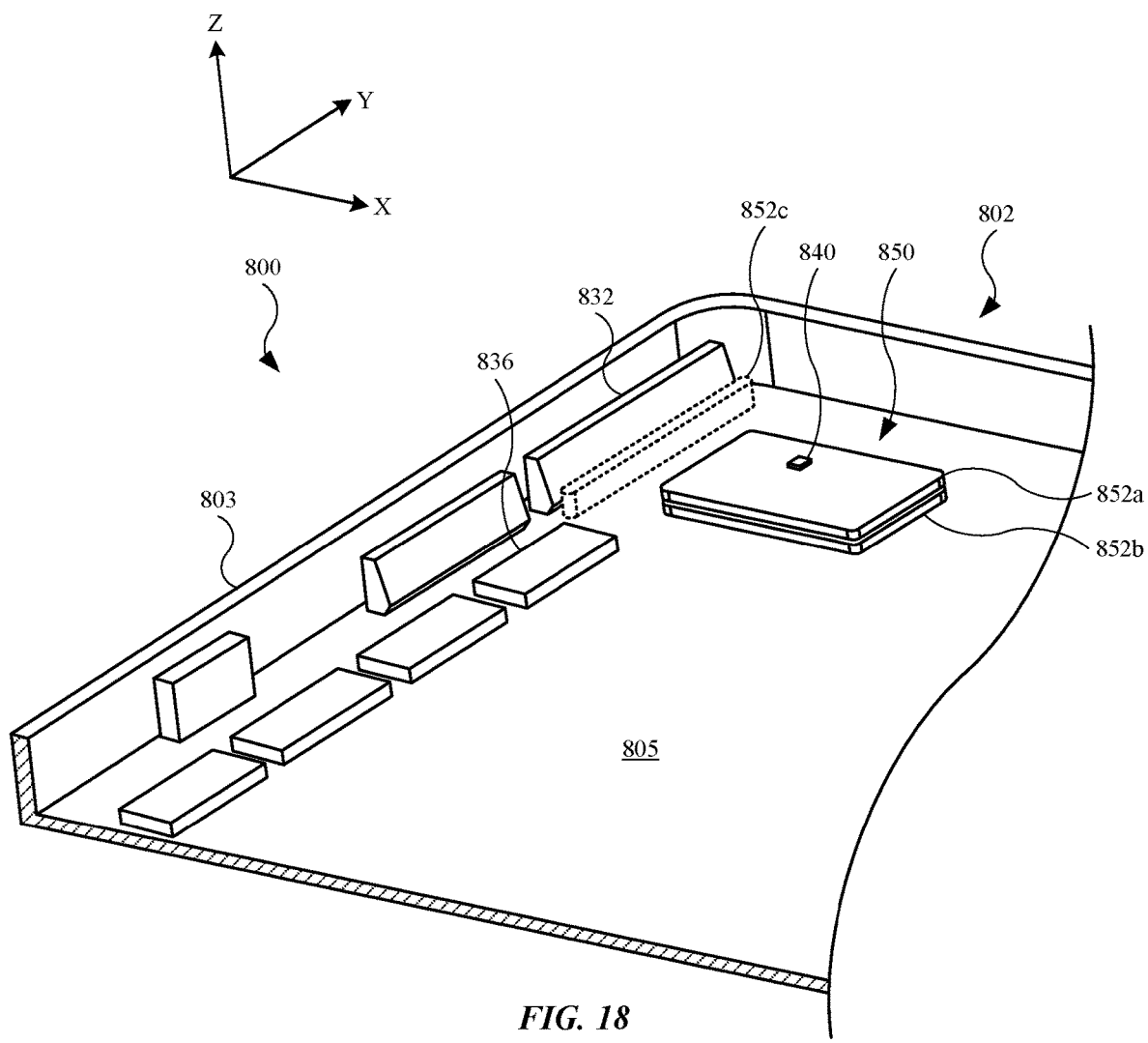
FIG. 18 illustrates an isometric view of an alternate embodiment of an electronic device, showing an alternate layout of a shunt assembly.

FIG. 18 illustrates an isometric view of an alternate embodiment of an electronic device 800, showing an alternate layout of a shunt assembly 850. Electronic device 800 may include several features previously shown and described for electronic device 100 (shown in FIG. 1). As shown, electronic device 800 includes a magnet 832 (representative of additional, unlabeled magnets) used to secure electronic device 800 to an accessory device (not shown in FIG. 18) along a sidewall 803 of enclosure 802. Further, electronic device 800 may include a magnet 836 (representative of additional, unlabeled magnets) used to secure electronic device 800 to an accessory device (not shown in FIG. 18) along a bottom wall 805 of enclosure 802.

Shunt assembly 850 includes a shunt element 852*a* stacked over a shunt element 852*b*. Shunt element 852*a* is separated from shunt element 852*b* by a gap (not labeled). The gap may be defined by an adhesive, as a non-limiting example. Shunt elements 852*a* and 852*b* may generally include the same size and shape. Optionally, shunt assembly 850 may include a shunt element 852*c* (shown as a dotted line). Shunt element 852*c* may include a dimension (i.e., major length) that is the same as, or substantially similar to, a dimension (i.e., major length) of magnet 832 along the Y-axis.

As shown, sensor 840 is positioned in proximity to magnet 832, and would otherwise detect the magnetic field from magnet 832. However, shunt assembly 850 sufficiently minimizes the magnetic field from magnet 832 (as well as other magnets in electronic device 800 that could potentially be detected by sensor 840) such that magnet 832 (as well as any other magnet in electronic device 800) does not provide a magnetic field at or above the threshold magnetic field required to trigger sensor 840.

Figure 19:
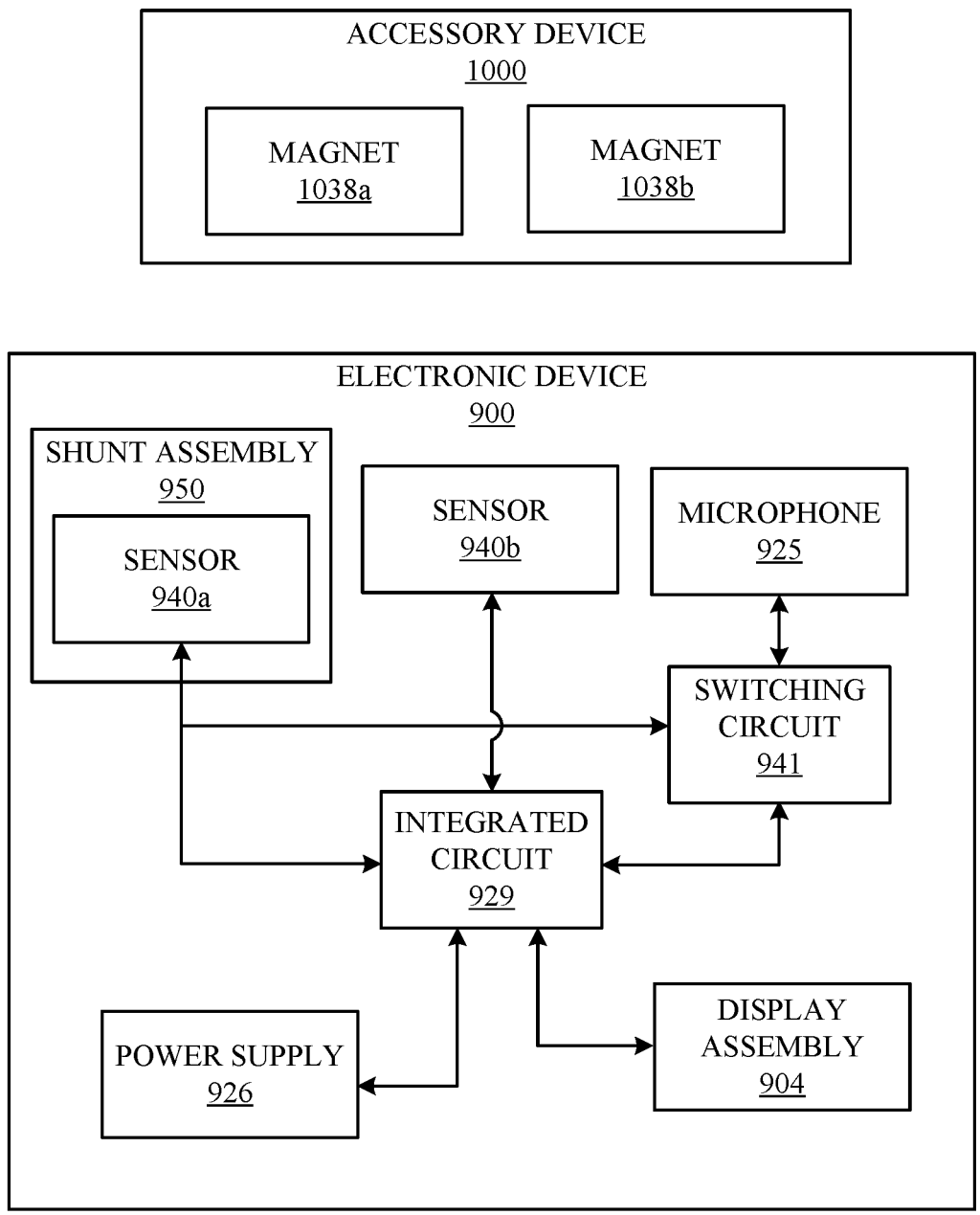
FIG. 19 illustrates a schematic diagram of an embodiment of an electronic device and an accessory device.

FIG. 19 illustrates a schematic diagram of an embodiment of an electronic device 900 and an accessory device 1000. Electronic devices and accessory devices shown and described in the foregoing detailed description may incorporate the features shown for electronic device 900 and accessory device 1000, respectively. Electronic device 900 and accessory device 1000 may include several features previously shown and described for electronic devices and accessory devices, respectively.

As shown, electronic device 900 includes an integrated circuit 929 designed perform one or more functions. Integrated circuit 929 may include a SOC, as a non-limiting example. Integrated circuit 929 is electrically coupled with a display assembly 904, which may include touch input display assembly. Electronic device 900 further includes a power supply 926, or battery, designed to provide electrical energy to operational components of electronic device 900.

Electronic device 900 further includes a sensor 940*a* and a sensor 940*b*, each of which may include a magnetic field sensor (e.g., Hall Effect sensor or AMR sensor). Sensors 940*a* and 940*b* can detect a magnet 1038*a* and a magnet 1038*b*, respectively, of accessory device 1000, and subsequently generate and provide electrical signals to integrated circuit 929. Integrated circuit 929 uses the electrical signals to determine accessory device 1000 is covering display assembly 904, and can subsequently deactivate display assembly 904. Also, sensor 940a may be positioned on a shunt assembly 950 designed to minimize magnetic fields from magnets (not shown in FIG. 19) within electronic device 900, while allowing (and in some instances, enhancing) the magnetic field provided by magnet 1038a.

Additionally, electronic device 900 includes a microphone 925 designed to capture audible sound generated externally to electronic device 900, and provide electrical signals, in accordance with the audible sound, to integrated circuit 929. Electronic device 900 further includes a switching circuit 941 that forms part of circuit with microphone 925 and integrated circuit 929. Switching circuit 941 may include any features previously described for a switching circuit.

In order to enhance user privacy, the transmission of electrical signals provided by microphone 925 to integrated circuit 929 can be terminated based on an input from sensor 940a to switching circuit 941. For example, when sensor 940a detects the magnetic field from magnet 1038a, the electrical signal initiated by sensor 940a is further provided to switching circuit 941, causing switching circuit 941 to open the circuit between integrated circuit 929 and microphone 925 (as well as any additional microphones). As a result, microphone 925 is unable to transmit communication (i.e., electrical signals) to integrated circuit 929. Moreover, the electrical signal provided by sensor 940a need not be initially processed by integrated circuit 929 in order for switching circuit 941 to open the circuit between microphone 925 and integrated circuit 929. Also, based the aforementioned design logic, integrated circuit 929 is not provided with information related to the open circuit, based on switching circuit 941, and thus does not actively monitor whether microphone 925 is operating in accordance with the desired function of providing electrical signals in accordance with detected audible sound. As a result, a user of electronic device 900 may enjoy enhanced privacy as integrated circuit 929 cannot receive and process electrical signals from microphone 925 in accordance with detected audible sound, nor is integrated circuit 929 provided with information that switching circuit 941 has opened the circuit between microphone 925 and integrated circuit 929.

Figure 20:
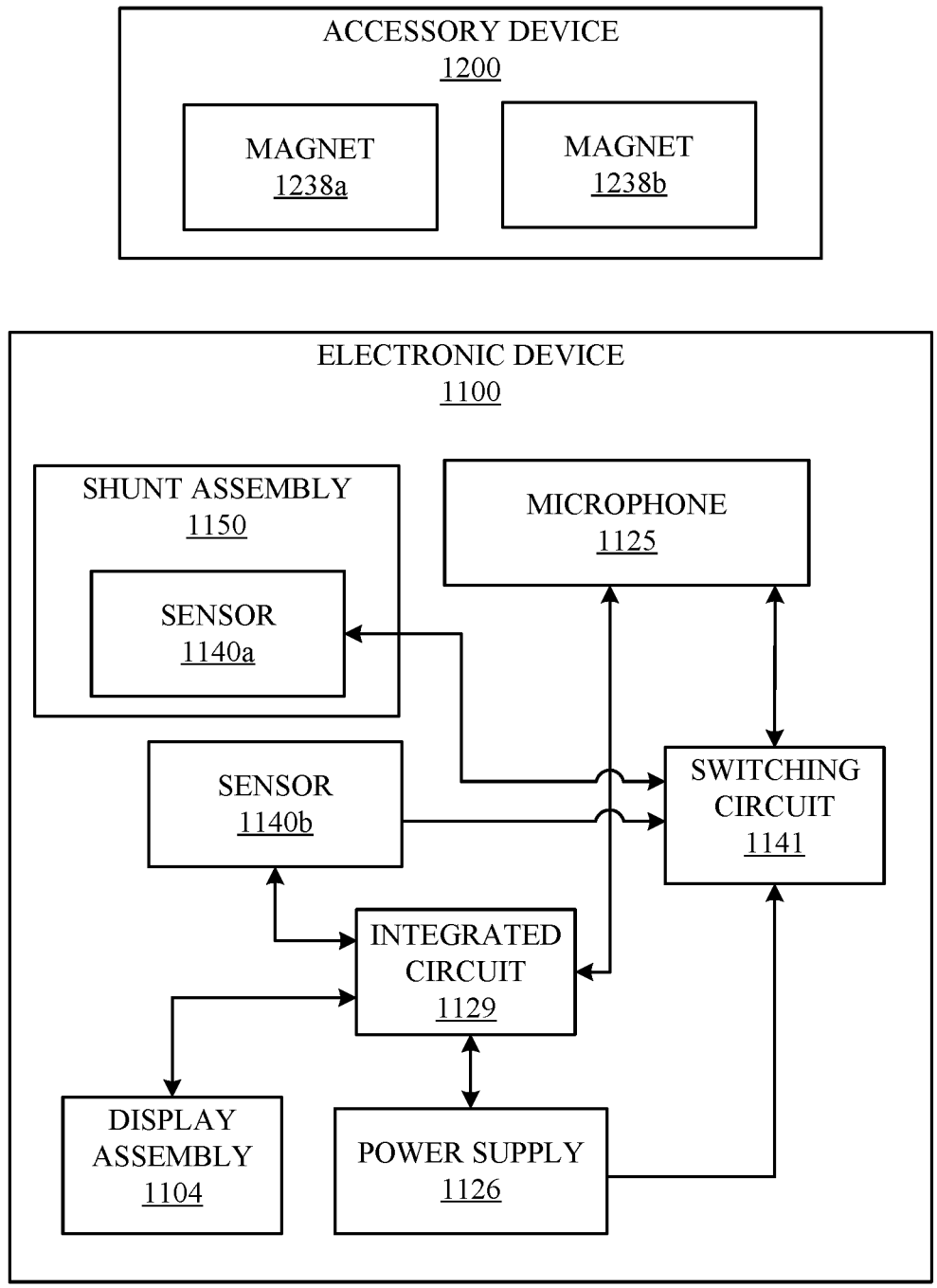
FIG. 20 illustrates a schematic diagram of an embodiment of an alternate embodiment of an electronic device and an accessory device.

FIG. 20 illustrates a schematic diagram of an embodiment of an electronic device 1100 and an accessory device 1200. Electronic devices and accessory devices shown and described in the foregoing detailed description may incorporate the features shown for electronic device 1100 and accessory device 1200, respectively. Electronic device 1100 and accessory device 1200 may include several features previously shown and described for electronic devices and accessory devices, respectively.

As shown, electronic device 1100 includes an integrated circuit 1129 designed perform one or more functions. Integrated circuit 1129 may include a SOC, as a non-limiting example. Integrated circuit 1129 is electrically coupled with a display assembly 1104, which may include touch input display assembly. Electronic device 1100 further includes a power supply 1126, or battery, designed to provide electrical energy to operational components of electronic device 1100.

Electronic device 1100 further includes a sensor 1140a and a sensor 1140b, each of which may include a magnetic field sensor (e.g., Hall Effect sensor or AMR sensor). Sensors 1140a and 1140b can detect a magnetic field from a magnet 1238a and a magnet 1238b, respectively, of accessory device 1200, and subsequently generate and provide electrical signals to integrated circuit 1129. Integrated circuit 1129 uses the electrical signals to determine accessory device 1200 is covering display assembly 1104, and can subsequently deactivate display assembly 1104. Also, sensor 1140a may be positioned on a shunt assembly 1150 designed to minimize magnetic fields from magnets (not shown in FIG. 20) within electronic device 1100, while allowing (and in some instances, enhancing) the magnetic field provided by magnet 1238a.

Additionally, electronic device 1100 includes a microphone 1125 designed to capture audible sound generated externally to electronic device 1100, and provide electrical signals, in accordance with the audible sound, to integrated circuit 1129. Electronic device 1100 further includes a switching circuit 1141 that forms part of circuit with microphone 1125 and integrated circuit 1129. Switching circuit 1141 may include any features previously described for a switching circuit.

In order to enhance user privacy, the transmission of electrical signals provided by microphone 1125 to integrated circuit 1129 can be terminated based on an input from sensor 1140a to switching circuit 1141. For example, when sensor 1140a detects the magnetic field from the magnet 1238a, the electrical signal initiated by sensor 1140a is further provided to switching circuit 1141. However, in contrast to the prior embodiment (shown in FIG. 19), switching circuit 1141 can subsequently open the circuit between microphone 1125 and power supply 1126, thereby powering down microphone 1125 (as well as any additional microphones). As a result, microphone 1125 is deactivated and will not be provide electrical signals (in accordance with detected audible sounds) to integrated circuit 1129, as microphone 1125 is off. Moreover, the electrical signal provided by sensor 1140a need not be initially processed by integrated circuit 1129 in order for switching circuit 1141 to open the circuit between microphone 1125 and power supply 1126. Also, based the aforementioned design logic, integrated circuit 1129 is not provided with information related to the open circuit, based on switching circuit 1141, and thus does not actively monitor whether microphone 1125 is operating in accordance with the desired function of providing electrical signals in accordance with detected audible sound. As a result, a user of electronic device 1100 may enjoy enhanced privacy as integrated circuit 1129 cannot receive and process electrical signals from microphone 1125 in accordance with detected audible sound, nor is integrated circuit 1129 provided with information that switching circuit 1141 has opened the circuit between microphone 1125 and power supply 1126.

Figure 21:
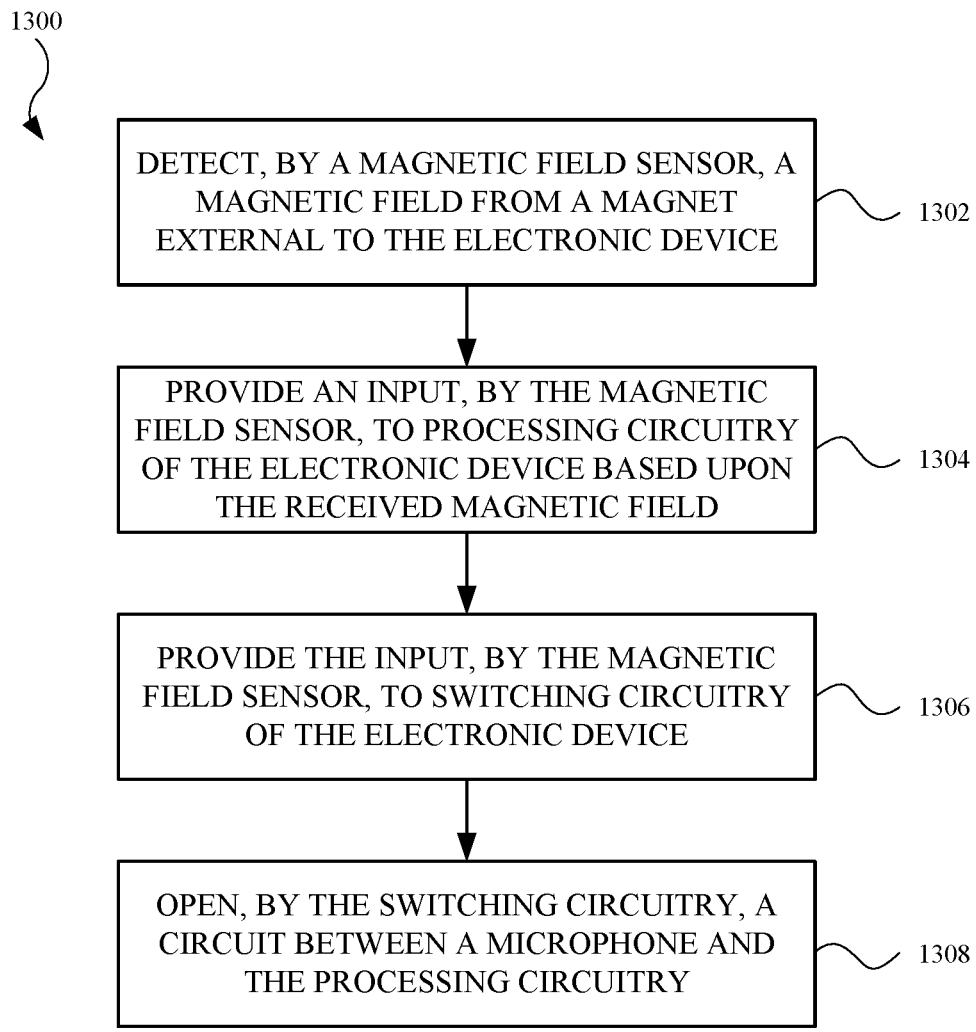
FIG. 21 illustrates a flowchart showing a method for deactivating a component of an electronic device, in accordance with some described embodiments.

FIG. 21 illustrates a flowchart showing a method 1300 for deactivating a component of an electronic device, in accordance with some described embodiments. Electronic devices described herein may perform the steps of method 1300.

In step 1302, a magnetic field from a magnet external to the electronic device is detected by a magnetic field sensor. The magnetic field sensor may include a Hall Effect sensor or an AMR sensor, as non-limiting examples. Also, the magnet may include a magnet located in an accessory device that is compatible with the electronic device.

In step 1304, an input is provided by the magnetic field sensor to an integrated circuit of the electronic device. The integrated circuit may include an integrated circuit, such as a SOC (as a non-limiting example). The input may include an electrical signal that is generated by the magnetic field sensor based on detection of the magnetic field by the magnetic field sensor. Once the input is provided to the processing circuity, the integrated circuit deactivates a display assembly of the electronic device. In some embodiments, the electronic device includes a second magnetic field sensor, and the integrated circuits deactivates the display assembly once both magnetic fields sensors provide an electrical signal.

In step 1306, the input is further provided by the magnetic field sensor to switching circuit of the electronic device. The switching circuit may include any features previously described for a switching circuit.

In step 1308, the switching circuit opens a circuit between a microphone and the integrated circuit. As a result of the open circuit, there is no transmission of electrical signals from the microphone to the integrated circuit, and accordingly, the integrated circuit is prevented from receiving the electrical signals associated with detected audible sound by the microphone.

The electrical signal sent by the magnetic field sensor need not be processed by the integrated circuit prior to the switching circuit opening the circuit. Despite the microphone being "on" or operational, the integrated circuit is unaware of the open circuit, as the integrated circuit is not provided with any indication that the microphone is inoperable to transmit electrical signals in accordance with the audible sound. As a result, the processing circuit is not actively monitoring the functionality of the microphone for errors related to the open circuit, and does not provide any output or other functionality in accordance with the open circuit between the microphone and the processing circuity. In this regard, the user of the electronic device may enjoy enhanced privacy, as the microphone is not transmitting electrical signals to the integrated circuit in accordance with the user's audible sound (i.e., the user's voice).

Figure 22:
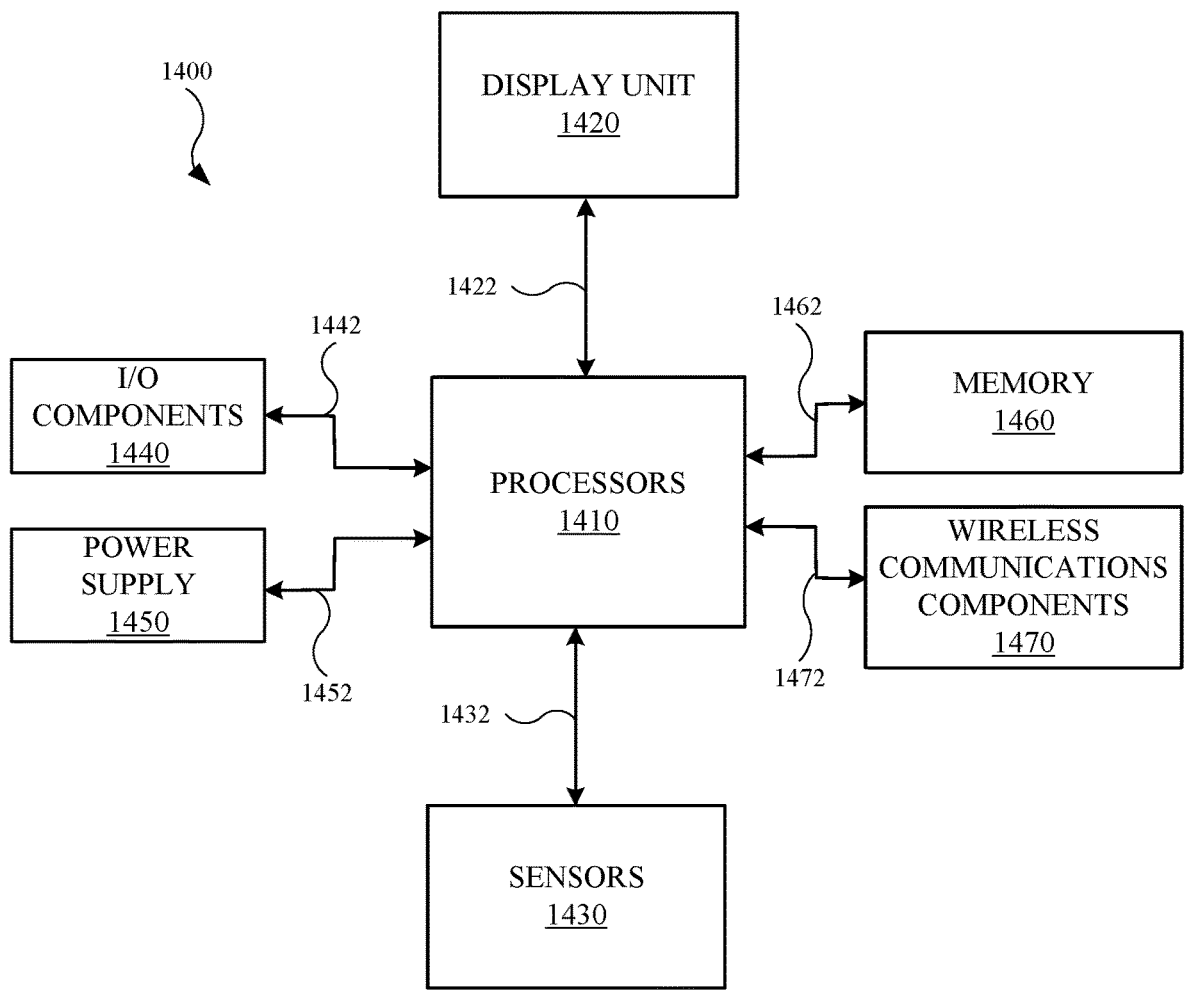
FIG. 22 illustrates a block diagram of an electronic device, in accordance with some described embodiments.

FIG. 22 illustrates a block diagram of an electronic device 1400, in accordance with some described embodiments. The features in electronic device 1400 may be present in other electronic devices described herein. Electronic device 1400 may include one or more processors 1410 for executing functions of electronic device 1400. One or more processors 1410 can refer to at least one of a central processing unit (CPU) and at least one microcontroller for performing dedicated functions. Also, one or more processors 1410 can refer to application specific integrated circuits.

According to some embodiments, electronic device 1400 can include a display unit 1420. Display unit 1420 is capable of presenting a user interface that includes icons (representing software applications), textual images, and/or motion images. In some examples, each icon can be associated with a respective function that can be executed by one or more processors 1410. In some cases, display unit 1420 includes a display layer (not illustrated), which can include a liquid-crystal display (LCD), light-emitting diode display (LED), or the like. According to some embodiments, display unit 1420 includes a touch input detection component and/or a force detection component that can be configured to detect changes in an electrical parameter (e.g., electrical capacitance value) when the user's appendage (acting as a capacitor) comes into proximity with display unit 1420 (or in contact with a transparent layer that covers display unit 1420). Display unit 1420 is connected to one or more processors 1410 via one or more connection cables 1422.

According to some embodiments, electronic device 1400 can include one or more sensors 1430 capable of provide an input to one or more processors 1410 of electronic device 1400. One or more sensors 1430 may include a temperature sensor, a capacitive sensor, and magnetic field sensors, as a non-limiting example. One or more sensors 1430 is/are connected to one or more processors 1410 via one or more connection cables 1432.

According to some embodiments, electronic device 1400 can include one or more input/output components 1440. In some cases, one or more input/output components 1440 can refer to a button or a switch that is capable of actuation by the user. When one or more input/output components 1440 are used, one or more input/output components 1440 can generate an electrical signal that is provided to one or more processors 1410 via one or more connection cables 1442.

According to some embodiments, electronic device 1400 can include a power supply 1450 that is capable of providing energy to the operational components of electronic device 1400. In some examples, power supply 1450 can refer to a rechargeable battery. Power supply 1450 can be connected to one or more processors 1410 via one or more connection cables 1452. Power supply 1450 can be directly connected to other devices of electronic device 1400, such as one or more input/output components 1440. In some examples, electronic device 1400 can receive power from another power sources (e.g., an external charging device) not shown in FIG. 22.

According to some embodiments, electronic device 1400 can include memory 1460, which can include a single disk or multiple disks (e.g., hard drives), and includes a storage management module that manages one or more partitions within memory 1460. In some cases, memory 1460 can include flash memory, semiconductor (solid state) memory or the like. Memory 1460 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 1400. In some embodiments, memory 1460 refers to a non-transitory computer readable medium. One or more processors 1410 can also be used to execute software applications. In some embodiments, a data bus 1462 can facilitate data transfer between memory 1460 and one or more processors 1410.

According to some embodiments, electronic device 1400 can include wireless communications components 1470. A network/bus interface 1472 can couple wireless communications components 1470 to one or more processors 1410. The wireless communications components 1470 can communicate with other electronic devices via any number of wireless communication protocols, including at least one of a global network (e.g., the Internet), a wide area network, a local area network, a wireless personal area network (WPAN), or the like. In some examples, wireless communications components 1470 can communicate using NFC protocol, BLUETOOTH® protocol, or WIFI® protocol.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
    a magnetic field sensor configured to detect a presence of a magnetic field;
    processing circuitry;
    a microphone configured to:
        convert audible sound to an electrical signal, and
        provide the electrical signal to the processing circuitry; and
    a switching circuit, wherein in response to detection of the presence of the magnetic field, the switching circuit opens a circuit between the microphone and the processing circuitry, thereby preventing the processing circuitry from receiving the electrical signal.

2. The electronic device of claim 1, wherein in response to the magnetic field sensor detecting the magnetic field generated externally with respect to the electronic device, the switching circuit opens the circuit.

3. The electronic device of claim 1, further comprising:
    an enclosure; and
    a device magnet located in the enclosure, the device magnet configured to secure with an accessory device, wherein the magnetic field sensor is configured to detect the presence of another magnetic field not generated by the device magnet.

4. The electronic device of claim 3, wherein:
    the enclosure comprises a sidewall, and
    the device magnet is located along the sidewall.

5. The electronic device of claim 1, further comprising a display, wherein the magnetic field sensor is configured to detect the presence of the magnetic field from a magnet in an accessory device covering the display.

6. The electronic device of claim 1, further comprising a second magnetic field sensor configured to detect a presence of a second magnetic field, wherein in response to a detection of the second magnetic field by second magnetic field sensor, the switching circuit opens the circuit.

7. The electronic device of claim 1, further comprising a shunt assembly, wherein the magnetic field sensor is positioned on the shunt assembly.

8. An electronic device, comprising:
    a magnetic field sensor configured to detect a presence of a magnetic field;
    processing circuitry;
    a microphone configured to convert audible sound to an electrical signal;
    a power supply; and
    a switching circuit, wherein in response to detection of the presence of the magnetic field, the switching circuit opens a circuit between the microphone and the power supply.

9. The electronic device of claim 8, wherein in response to opening the circuit, the switching circuit renders the microphone inoperable.

10. The electronic device of claim 8, wherein in response to the magnetic field sensor detecting the magnetic field generated externally with respect to the electronic device, the switching circuit opens the circuit.

11. The electronic device of claim 8, further comprising:
    an enclosure; and
    a device magnet located in the enclosure, the device magnet configured to secure with an accessory device, wherein the magnetic field sensor is configured to detect the presence of a magnetic field not generated by the device magnet.

12. The electronic device of claim 11, wherein:
    the enclosure comprises a sidewall, and
    the device magnet is located along the sidewall.

13. The electronic device of claim 8, further comprising a display, wherein the magnetic field sensor is configured to detect the presence of the magnetic field from a magnet in an accessory device covering the display.

14. The electronic device of claim 8, further comprising a second magnetic field sensor configured to detect a presence of a second magnetic field, wherein in response to a detection of the second magnetic field by second magnetic field sensor, the switching circuit opens the circuit.

15. A method claim for managing a microphone in an electronic device, the method comprising:
    detecting, by a magnetic field sensor, a magnetic field;
    in response to detecting the magnetic field, opening a circuit between the microphone and a component; and
    preventing, based on opening the circuit, audible signals to the electronic device via the microphone.

16. The method of claim 15, wherein opening the circuit between the microphone and the component comprises opening the circuit between the microphone and a power supply.

17. The method of claim 15, wherein opening the circuit between the microphone and the component comprises opening the circuit between the microphone and a processing circuit.

18. The method of claim 15, wherein detecting the magnetic field comprises detecting, from a magnet external to the electronic device, the magnetic field.

19. The method of claim 15, wherein detecting the magnetic field comprises detecting, from a magnet located in an accessory device, the magnetic field in response to the accessory device covering a display of the electronic device.

20. The method of claim 15, wherein opening the circuit comprises rendering the microphone inoperable to receive the audible signals.

* * * * *

UNITED STATES PATENT AND TRADEMARK OFFICE
CERTIFICATE OF CORRECTION

PATENT NO. : 12,019,470 B2  
APPLICATION NO. : 18/231725  
DATED : June 25, 2024  
INVENTOR(S) : Christopher M. Pinciuc et al.

Page 1 of 1

It is certified that error appears in the above-identified patent and that said Letters Patent is hereby corrected as shown below:

On the Title Page

Column 2 Item (56), Line 1 Under OTHER PUBLICATIONS: "Machine translation of Srec Chinese Patent Document CN 106055042 B May 19, 2020 (Year: 2020).*" should read --Machine translation of Stryker Chinese Patent Document CN 106055042 B May 19, 2020 (Year: 2020).*--.

Signed and Sealed this  
Seventeenth Day of September, 2024

Katherine Kelly Vidal  
*Director of the United States Patent and Trademark Office*